(12) United States Patent
Li et al.

(10) Patent No.: US 12,289,120 B2
(45) Date of Patent: Apr. 29, 2025

(54) ERASING-BASED LOSSLESS COMPRESSION AND DECOMPRESSION METHODS FOR FLOATING-POINT DATA

(71) Applicant: Chongqing University, Chongqing (CN)

(72) Inventors: Ruiyuan Li, Chongqing (CN); Jun Jiang, Chongqing (CN); Chao Chen, Chongqing (CN); Dongxia Zhang, Guangdong (CN); Zheng Li, Chongqing (CN); Yi Wu, Chongqing (CN)

(73) Assignee: Chongqing University, Chongqing (CN)

( * ) Notice: Subject to any disclaimer, the term of this patent is extended or adjusted under 35 U.S.C. 154(b) by 164 days.

(21) Appl. No.: 18/308,496

(22) Filed: Apr. 27, 2023

(65) Prior Publication Data

US 2024/0250694 A1    Jul. 25, 2024

(30) Foreign Application Priority Data

Jan. 16, 2023  (CN) .......................... 202310068186.3
Jan. 16, 2023  (CN) .......................... 202310070527.0

(51) Int. Cl.
*H03M 7/24*    (2006.01)
*H03K 19/21*   (2006.01)

(52) U.S. Cl.
CPC ............. *H03M 7/24* (2013.01); *H03K 19/21* (2013.01)

(58) Field of Classification Search
CPC .......... H03M 7/24; H03M 7/30; H03K 19/21
See application file for complete search history.

(56) References Cited

U.S. PATENT DOCUMENTS

| | | | | |
|---|---|---|---|---|
| 5,257,215 A * | 10/1993 | Poon | ....................... | H03M 7/24 708/235 |
| 5,508,948 A * | 4/1996 | Hatta | ....................... | G06F 17/10 708/204 |
| 5,732,007 A * | 3/1998 | Grushin | .................. | G06F 5/012 708/205 |
| 5,768,171 A * | 6/1998 | Chow | .................. | G06F 1/0356 708/502 |
| 5,781,464 A * | 7/1998 | Mehta | .................. | G06F 7/5055 708/496 |
| 5,948,049 A * | 9/1999 | Miyanishi | ............... | G06F 5/012 708/205 |
| 6,384,748 B1 * | 5/2002 | Asherman | ................. | G06F 7/38 341/83 |

(Continued)

OTHER PUBLICATIONS

Liakos, Panagiotis, Katia Papakonstantinopoulou, and Yannis Kotidis. "Chimp: efficient lossless floating point compression for time series databases." *Proceedings of the VLDB Endowment* 15.11 (2022): 3058-3070.

(Continued)

*Primary Examiner* — Lam T Mai
(74) *Attorney, Agent, or Firm* — NSIP Law

(57) ABSTRACT

Embodiments of the present disclosure propose an Erasing-based Lossless Floating-point compression method, i.e., Elf. The main idea of Elf is to erase the last few bits (i.e., set them to zero) of floating-point values, so the XORed values are supposed to contain many trailing zeros, where the erased bits are determined based on the decimal place count and the digits on the exponent bits.

20 Claims, 7 Drawing Sheets

(56) References Cited

U.S. PATENT DOCUMENTS

| | | | | |
|---|---|---|---|---|
| 7,552,165 | B2* | 6/2009 | Purcell | G06F 7/49947 |
| | | | | 708/505 |
| 10,574,260 | B2* | 2/2020 | Li | G06F 9/30014 |
| 11,801,600 | B1* | 10/2023 | Ding | B25J 9/1664 |
| 11,956,307 | B1* | 4/2024 | Li | H04L 67/1023 |
| 2003/0140074 | A1* | 7/2003 | Hoskote | G06F 7/485 |
| | | | | 708/211 |
| 2006/0265439 | A1* | 11/2006 | Kaplun | G06F 7/74 |
| | | | | 708/160 |
| 2007/0050436 | A1* | 3/2007 | Chen | G06F 7/491 |
| | | | | 708/204 |
| 2008/0270499 | A1* | 10/2008 | Lundvall | G06F 7/491 |
| | | | | 708/204 |
| 2013/0124588 | A1* | 5/2013 | Kroener | G06F 7/49915 |
| | | | | 708/203 |
| 2017/0024207 | A1* | 1/2017 | Lundvall | H03M 7/24 |
| 2023/0383386 | A1* | 11/2023 | Tan | C22C 23/04 |
| 2023/0408385 | A1* | 12/2023 | Peng | G01N 3/307 |
| 2023/0416129 | A1* | 12/2023 | Chai | C02F 3/302 |
| 2024/0013368 | A1* | 1/2024 | Wang | G06T 7/11 |
| 2024/0025023 | A1* | 1/2024 | Luo | B25B 23/147 |
| 2024/0025786 | A1* | 1/2024 | Guan | C02F 9/00 |
| 2024/0054444 | A1* | 2/2024 | Chen | G06Q 10/047 |
| 2024/0061396 | A1* | 2/2024 | Huang | G05B 19/4065 |
| 2024/0100972 | A1* | 3/2024 | Wu | H01F 27/366 |
| 2024/0111288 | A1* | 4/2024 | Pu | G01C 21/38 |
| 2024/0116533 | A1* | 4/2024 | Pu | G06T 17/005 |
| 2024/0125826 | A1* | 4/2024 | Ming | G01R 27/18 |
| 2024/0142546 | A1* | 5/2024 | Li | G01R 31/2601 |
| 2024/0158994 | A1* | 5/2024 | Cui | E01C 19/00 |
| 2024/0163821 | A1* | 5/2024 | Wang | H04W 56/0035 |
| 2024/0191727 | A1* | 6/2024 | Cheng | F15B 13/0417 |
| 2024/0200165 | A1* | 6/2024 | Fu | C22B 59/00 |
| 2024/0201728 | A1* | 6/2024 | Wang | G06F 18/295 |
| 2024/0204895 | A1* | 6/2024 | Wang | H04L 67/12 |
| 2024/0205572 | A1* | 6/2024 | Zeng | H04Q 11/0062 |
| 2024/0211656 | A1* | 6/2024 | Su | E21B 47/007 |
| 2024/0230704 | A1* | 7/2024 | Zhou | G01P 15/12 |
| 2024/0243829 | A1* | 7/2024 | Wei | H04J 3/0661 |

OTHER PUBLICATIONS

Pelkonen, Tuomas, et al. "Gorilla: a fast, scalable, in-memory time series database." *Proceedings of the VLDB Endowment* 8.12 (2015): 1816-1827.

* cited by examiner

200

S1 Acquire the stored XORed result and the modified decimal significand count of a floating-point value

S2 Perform XOR operation on the XORed result and the mantissa prefix number of the previous floating-point value, to obtain the mantissa prefix number of the floating-point value

S3 Obtain the decimal place count of the floating-point value

S4 Recover the floating-point value based on the mantissa prefix number of the floating-point value and the the decimal place count of the floating-point value

Fig. 5

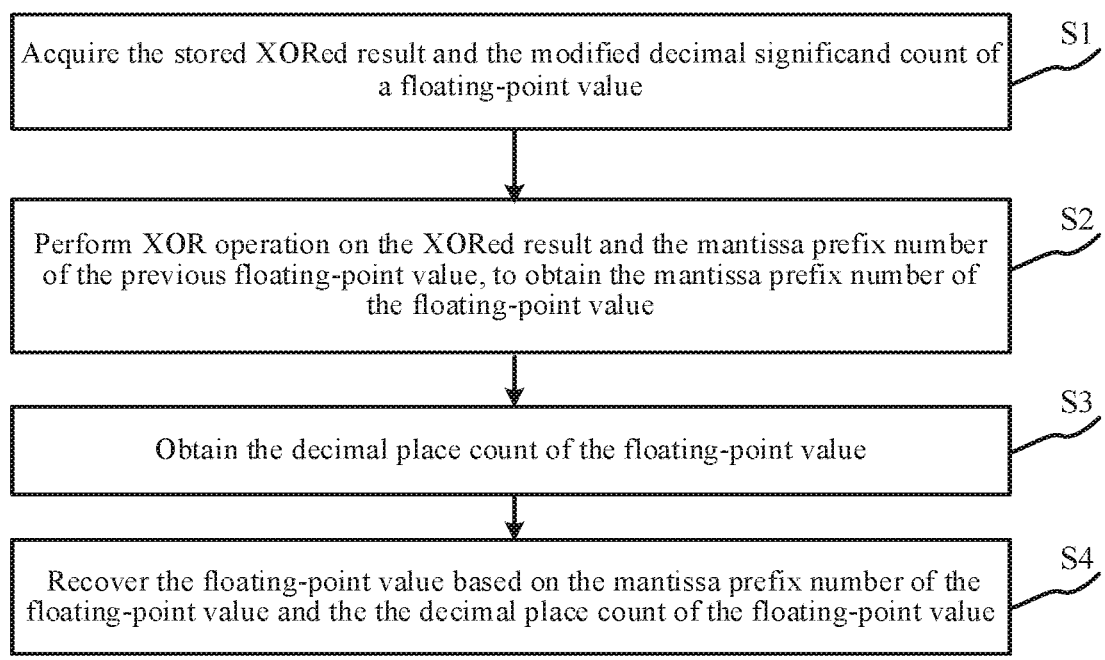

ERASING-BASED LOSSLESS COMPRESSION AND DECOMPRESSION METHODS FOR FLOATING-POINT DATA

CROSS-REFERENCE TO RELATED APPLICATIONS

This application claims the priorities from Chinese Patent Application No. 202310068186.3 filed on Jan. 16, 2023 and Chinese Patent Application No. 202310070527.0 filed on Jan. 16, 2023 before the China National Intellectual Property Administration (CNIPA), the entire disclosure of which are incorporated herein by reference in their entity.

TECHNICAL FIELD

Embodiments of the present disclosure relate to the field of computer technology, particularly to the field of lossless data compression method, and more particularly to an erasing-based lossless compression and decompression methods for Floating-point Data.

BACKGROUND

The advance of sensing devices and Internet of Things has brought about the explosion of time series data. A significant portion of time series data are floating-point values produced at an unprecedentedly high rate in a streaming fashion. If these huge floating-point time series data (abbr. time series or time series data in the following) are transmitted and stored in their original format, it would take up a lot of network bandwidth and storage space, which not only causes expensive overhead, but also reduces the system efficiency and further affects the usability of some critical applications. Therefore, when processing or storing floating-point data, it is necessary to first compress the floating-point data according to a certain algorithm while meeting certain accuracy requirements. The compressed floating-point data will occupy less storage space, operation resources and transmission resources.

Normally, there are two categories of compression methods specifically for floating-point time series data, i.e., lossy compression algorithms and lossless compression algorithms. The former would lose some information, and thus it is not suitable for scientific calculation, data management or other critical scenarios, in which any error could result in disastrous consequences. To this end, lossless floating-point time series compression has attracted extensive interest for decades. One representative lossless algorithm is based on the XOR operation.

As shown in FIG. 1, given a time series of double-precision floating-point values, suppose the current value and its previous one are 3.17 and 3.25, respectively. If not compressed, each value will occupy 64 bits in its underlying storage. When compressing, the XOR-based compression algorithm performs an XOR operation on 3.17 and 3.25, i.e., $\Delta=3.17 \oplus 3.25$. When decompressing, it recovers 3.17 through another XOR operation, i.e., $3.17=\Delta \oplus 3.25$. Because two consecutive values in a time series tend to be similar, the underlying representation of $\Delta$ is supposed to contain many leading zeros (and maybe many trailing zeros). Therefore, we can record $\Delta$ by storing the center bits along with the numbers of leading zeros and trailing zeros, which usually takes up less than 64 bits. Thus, floating-point values are compressed by omitting directly storing of the leading zeros and trailing zeros.

Gorilla (see Pelkonen, T., Franklin, S., Teller, J., Cavallaro, P., Huang, Q., Meza, J., Veeraraghavan, K.: Gorilla: A fast, scalable, in-memory time series database. Proceedings of the VLDB Endowment 8(12), 18161827 (2015)) and Chimp (see Liakos, P., Papakonstantinopoulou, K., Kotidis, Y.: Chimp: efficient lossless floating point compression for time series databases. Proceedings of the VLDB Endowment 15(11), 3058{3070(2022)} are two state-of-the-art XOR-based lossless floating-point compression methods. Gorilla assumes that the XORed result of two consecutive floating-point values is likely to have both many leading zeros and trailing zeros. However, the XORed result actually has very few trailing zeros in most cases. As shown in FIG. 2, if we perform an XOR operation on each value with its previous one (just as Gorilla and Chimp did), there are as many as 95% XORed results containing no more than 5 trailing zeros. Instead of using the exactly previous one value, the Chimp work proposes Chimp128 which selects from the previous 128 values the one that produces an XORed result with the most trailing zeros. However, as shown in FIG. 2, when we investigate the trailing zeros' distribution of the XORed results produced by Chimp128, there are still up to 60% of them having no more than 5 trailing zeros.

However, increasing the number of trailing zeros of the XORed results plays a significant role in improving the compression ratio for time series.

SUMMARY

Embodiments of the present disclosure propose an erasing-based lossless compression method for floating-point values, an erasing-based lossless decompression method for floating-point values, an electronic device, and a non-transitory computer readable storage medium.

In a first aspect, some embodiments of the present disclosure provide an erasing-based lossless compression method for floating-point values. The method includes: acquiring a floating-point value, and calculating a decimal place count of the floating-point value; transforming the floating-point value into a binary format, where the floating-point value in the binary format is composed of a digit on a sign bit, digits on exponent bits, and digits on mantissa bits; determining, in the mantissa bits, a reference mantissa bit based on the decimal place count and the digits on the exponent bits; performing erasing operation on bits following the reference mantissa bit by setting corresponding digits on the bits following the reference mantissa bit to be zero, to obtain a value in the binary format, and using the value in the binary format obtained by the erasing operation as a mantissa prefix number of the floating-point value; inputting the mantissa prefix number of the floating-point value into an eXclusive OR (XOR) based compressor, to obtain an XORed result, and storing the XORed result.

In a second aspect, some embodiments of the present disclosure provide an erasing-based lossless decompression method for floating-point values. The method includes: acquiring an XORed result and a modified decimal significand count of a floating-point value, where the XORed result is obtained during compression of the floating-point value by performing XOR operation on a mantissa prefix number of the floating-point value and a mantissa prefix number of a previous floating-point value; performing XOR operation on the XORed result and the mantissa prefix number of the previous floating-point value, to obtain a mantissa prefix number of the floating-point value; calculating a decimal place count of the floating-point value based on the modified decimal significand count of a floating-point value; and recovering the floating-point value based on the mantissa prefix number of the floating-point value and the decimal place count of the floating-point value.

In a third aspect, some embodiments of the present disclosure provide an electronic device. The electronic device includes at least one processor; and a memory communicatively connected to the at least one processor; where, the memory stores instructions executable by the at least one processor, and the instructions, when executed by the at least one processor, cause the at least one processor to perform the method described in any one of the embodiments described in the first and second aspects.

In a fourth aspect, some embodiments of the present disclosure provide a non-transitory computer readable storage medium, storing computer instructions thereon, where the computer instructions are used to cause the computer to perform the method described in any one of the embodiments described in the first and second aspects.

BRIEF DESCRIPTION OF THE DRAWINGS

After reading detailed descriptions of non-limiting embodiments given with reference to the following accompanying drawings, other features, objectives and advantages of the present disclosure will be more apparent:

FIG. 5 is a flowchart of an erasing-based lossless decompression method for floating-point values according to an embodiment of the present disclosure;

FIG. 6 is an example for explaining the intuition of the Erasing-based Lossless Floating-Point (Elf) eraser;

DETAILED DESCRIPTION OF EMBODIMENTS

Embodiments of the present disclosure is further described below in detail in combination with the accompanying drawings. It may be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should be noted that, in the specification, the expressions such as "first," "second" and "third" are only used to distinguish one feature from another, rather than represent any limitations to the features. It should be further understood that the terms "comprise," "comprising," "having," "include" and/or "including," when used in the specification, specify the presence of stated features, elements and/or components, but do not exclude the presence or addition of one or more other features, elements, components and/or combinations thereof. In addition, expressions such as "at least one of," when preceding a list of listed features, modify the entire list of features rather than an individual element in the list. Further, the use of "may," when describing the implementations of the present disclosure, relates to "one or more implementations of the present disclosure". Also, the term "exemplary" is intended to refer to an example or illustration.

It should be noted that embodiments in the present disclosure and the features in the embodiments may be combined with each other on a non-conflict basis. Embodiments of the present disclosure will be described below in detail with reference to the accompanying drawings.

Figures 1, 2:
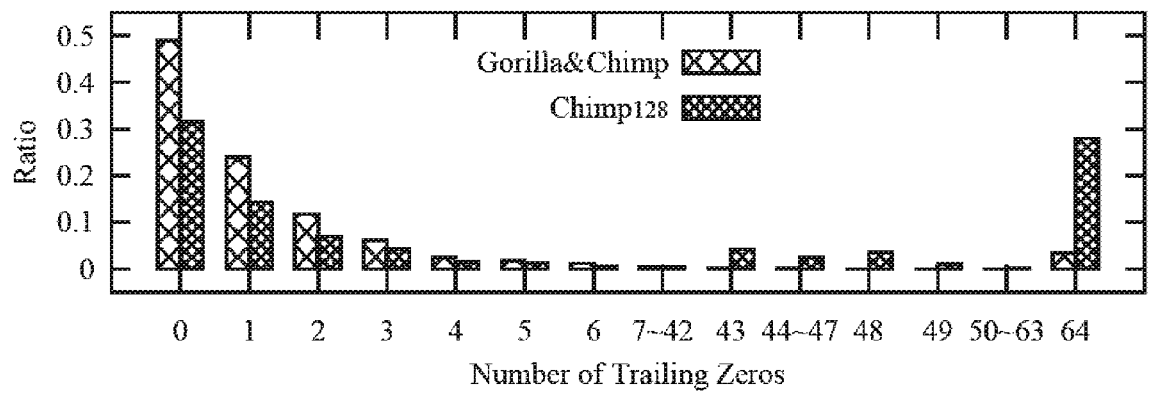
FIG. 1 is an example of a XOR-based compression method.
FIG. 2 is the distribution of trailing zero's count in existing XOR-based compression methods.
Figure 3:
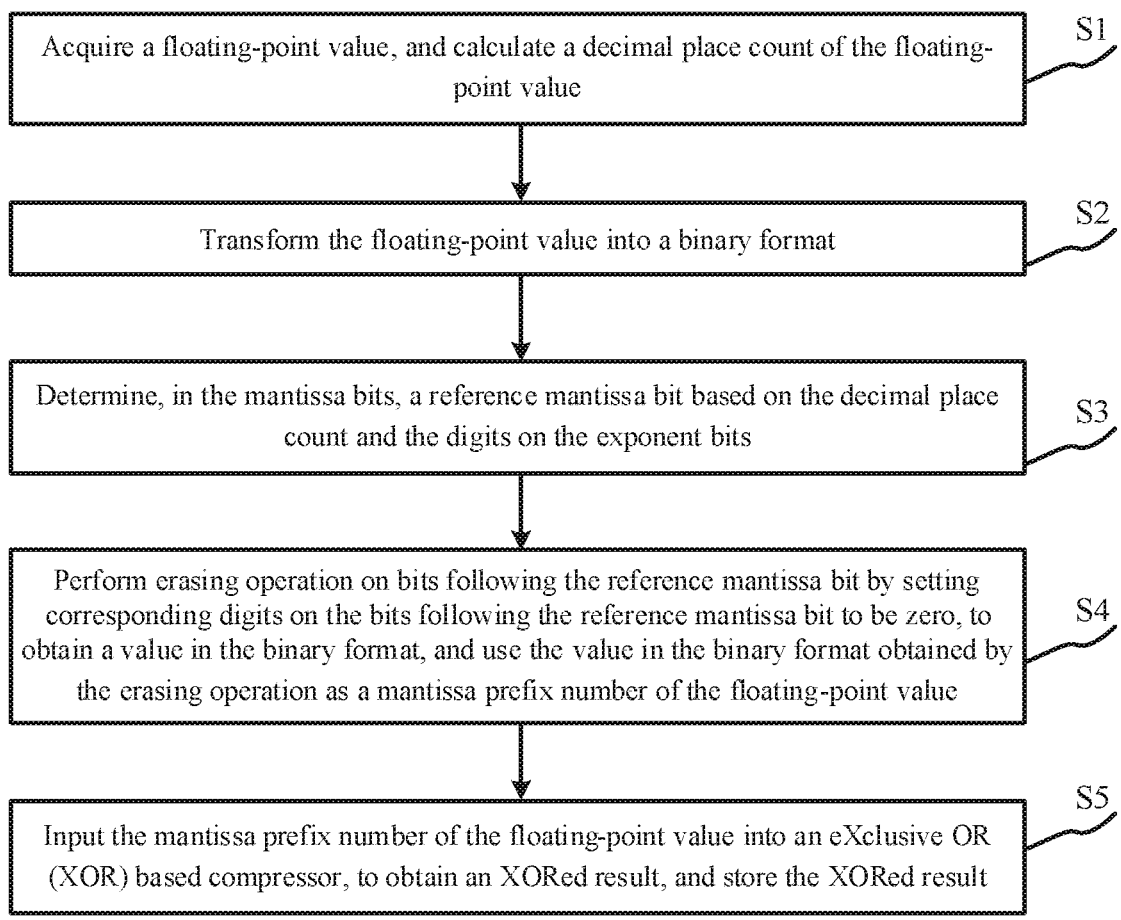
FIG. 3 is a flowchart of an erasing-based lossless compression method for floating-point values according to an embodiment of the present disclosure.

FIG. 3 illustrates the flowchart of an erasing-based lossless compression method for floating-point values according to an embodiment of the present disclosure. The erasing-based lossless compression method for floating-point values comprises following steps.

Step 1: acquiring a floating-point value, and calculating a decimal place count of the floating-point value.

In the embodiment, the floating point value may be a single-precision floating-point value or a double-precision floating point value. The decimal place count of the floating-point value is the count of decimal place(s) in the floating-point value in the decimal format. For example, for a floating-point value 3.17, the decimal place count thereof is 2. For another example, for a floating-point value −0.0314, the decimal place count thereof is 4. For another example, for a floating-point value 314.0, the decimal place count thereof is 1.

S2: transforming the floating-point value into a binary format, wherein the floating-point value in the binary format is composed of a digit on a sign bit, digits on exponent bits, and digits on mantissa bits.

Figure 4:
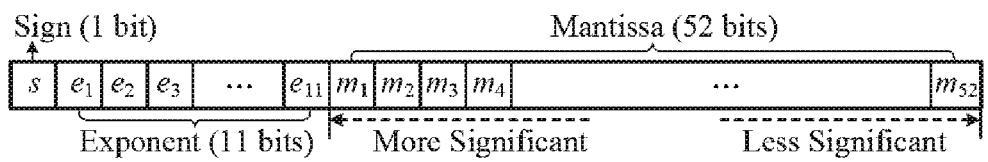
FIG. 4 is the data structure of double-precision floating-point format.

In the embodiment, the floating-point value is transformed from the decimal format into the binary format. The floating-point value in the binary format may be a double floating-point value occupying 64 bits, which include 1 sign bit, 11 exponent bits, and 52 mantissa bits, just as illustrated in FIG. 4. Alternatively, the floating-point value in the binary format may be a single floating-point value occupying 32 bits, which include 1 sign bit, 8 exponent bits, and 23 mantissa bits. The floating-point value in the binary format is composed of a digit on the sign bit, digits on the exponent bits, and digits on the mantissa bits. For example, for the floating-point value 3.17, it may be transformed into its binary format, i.e., "0 10000000000 1001010111000010100011110101110000101000111101011100", then the binary format of the floating-point value 3.17 is composed of one digit "0" on the sign bit, 11 digits "10000000000" on the exponent bits, and 52 digits "100101011100001010001111010111000010100011110101 1100" on the mantissa bits.

S3: determining, in the mantissa bits, a reference mantissa bit based on the decimal place count and the digits on the exponent bits.

In the embodiment, a reference mantissa bit (the mantissa bits after this reference mantissa bit will be erased) is determined in the mantissa bits of the floating-point value, based on the decimal place count and the digits on the exponent bits.

In an alternative implementation of the embodiment, the floating-point value in the binary format may be a floating-point value occupying 64 bits, and then the reference mantissa bit may be determined by:

$$g(\alpha) = \lceil \alpha \times \log_2 10 \rceil + e - 1023$$

$$e = (e_1 e_2 \ldots e_{11})_2 = \sum_{i=1}^{11} e^i \times 2^{11-i}$$

where $\alpha$ denotes the decimal place count of the floating-point value, $g(\alpha)$ denotes the place of the reference mantissa bit in the mantissa bits of the floating-point value, and $e_i$ denotes a digit on the $i^{th}$ exponent bit in the exponent bits of the floating-point value. The operator $\lceil x \rceil$ means round x up. That is, the digit on the reference mantissa bit is $m_{g(\alpha)}$, then the digits $<m_{g(\alpha)+1}, \ldots, m_{52}>$ on the mantissa bits after the reference mantissa bit $g(\alpha)$ are set to be zero, and thus the mantissa bits after the reference mantissa bit $g(\alpha)$ are erased.

In an alternative implementation of the embodiment, the floating-point value in the binary format may be a floating-point value occupying 32 bits, and then the reference mantissa bit is determined by:

$$g(\alpha) = \lceil \alpha \times \log_2 10 \rceil + e - 127$$

$$e = (e_1 e_2 \ldots e_8)_2 = \sum_{i=1}^{8} e^i \times 2^{8-i}$$

where $\alpha$ denotes the decimal place count of the floating-point value, $g(\alpha)$ denotes the place of the reference mantissa bit in the mantissa bits of the floating-point value, and $e_i$ denotes a digit on the $i^{th}$ exponent bit in the exponent bits of the floating-point value. Therefore, the digit on the reference mantissa bit is $m_{g(\alpha)}$, then the digits $<m_{g(\alpha)+1}, \ldots, m_{23}>$ on the mantissa bits after the reference mantissa bit $g(\alpha)$ are set to be zero, and thus the mantissa bits after the reference mantissa bit $g(\alpha)$ are erased.

S4: performing erasing operation on bits following the reference mantissa bit by setting corresponding digits on the bits following the reference mantissa bit to be zero, to obtain a value in the binary format, and using the value in the binary format obtained by the erasing operation as a mantissa prefix number of the floating-point value.

In the embodiment, the bits following the reference mantissa bit $g(\alpha)$ are erased by setting corresponding digits on the bits following the reference mantissa bit $g(\alpha)$ to be zero. A value in the binary format is obtained by the erasing. The value in the binary format obtained by the erasing is used as mantissa prefix number of the floating-point value. For example, given the float-point value 3.17, the decimal place count thereof is $\alpha=2$, the float-point value 3.17 is transformed into binary format, i.e., "0 10000000000 1001010111000010100011110101110000101000111101011 100", then it may be calculated that $e=(e_1 e_2 \ldots e_{11})_2=\sum_{i=1}^{11} e^i \times 2^{11-i} = 1 \times 2^{10} = 1024$, $g(\alpha)=\lceil \alpha \times \log_2 10 \rceil + e - 1023 = 8$, it indicates that the $8^{th}$ mantissa bit is determined as the reference mantissa bit, and then mantissa bits after the $8^{th}$ mantissa bit are erased from the binary format of the floating value 3.17 to obtain a value "0 10000000000 1001010100000000000000000000000000000000000000000000". The value "0 10000000000 1001010100000000000000000000000000000000000000000000" may be used as the mantissa prefix number of the floating-point value 3.17.

S5: inputting the mantissa prefix number of the floating-point value into an eXclusive OR (XOR) based compressor, to obtain an XORed result, and storing the XORed result.

In the embodiment, the mantissa prefix number of the floating-point value is inputted in to an eXclusive OR (XOR) based compressor, to obtain an XORed result. In an alternative implementation, the mantissa prefix number of the floating-point value may be inputted in to an eXclusive OR (XOR) based compressor, to perform XOR operation on the mantissa prefix number of the floating-point value and a mantissa prefix number of a previous floating-point value, to obtain the XORed result. For example, as illustrated in FIG. 6, the floating-point value may be 3.17 and the previous floating-point value may be 3.25, then the mantissa prefix numbers thereof are "0 10000000000 1001010100000000000000000000000000000000000000000000" and "0 10000000000010100000000000000000000000000000000000000000000000000" respectively, then XOR operation is performed on the mantissa prefix numbers to obtain an XORed result "0 00000000000 0011010100000000000000000000000000000000000000000000" (i.e., denoted by $\Delta'$). A lot of leading zeros and tailing zeros are produced. The XORed result is stored, for recovering the original floating-point value later. For example, the XORed result is stored by recording the center bits and the numbers of leading zeros and the trailing zeros.

The compression method transforms a floating-point value to another one with more trailing zeros under a guaranteed bound, so it can potentially improve the compression ratio of most XOR-compression methods tremendously.

In an alternative implementation, the decimal place count of the floating-point value may be also stored, so that the XORed result and the decimal place count of the floating-point value form the lossless compressed data for recovering the floating-point value.

In an alternative implementation, a modified decimal significand count of the floating-point value may be calculated and then also be stored, so that the XORed result and the modified decimal significand count of the floating-point value form the lossless compressed data for recovering the floating-point value. The modified decimal significand count of the floating-point value may be used for later recovering the decimal place count of the floating-point value.

In an alternative implementation, the modified decimal significand count of the floating-point value may be calculated by:

$$\beta^* = DS^*(v) = \begin{cases} 0 & v = 10^{-i}, i > 0 \\ \beta & \text{others} \end{cases}$$

where v denotes the floating-point value, $\beta^*$ denotes the modified decimal significand count of the floating-point value, and $\beta$ denotes a decimal significand count of the floating-point value. Decimal significand count of a floating-point value refers to the count of significand place(s) in decimal format, e.g., the decimal significand count of 3.17 is 3, the decimal significand count of −0.0314 is 3, and the decimal significand count of 3.140 is 4. For example, for the floating point value 3.17, the modified decimal significand count thereof is equal to the decimal significand count thereof, which is 3. Since the decimal significand count $\beta$ of a double value would not be greater than 17, it requires much fewer bits to store $\beta$.

According to the embodiment of the present disclosure, a reference mantissa bit in the mantissa bits is determined based on the decimal place count and the digits on the exponent bits, then bits following the reference mantissa bit are erased (i.e., corresponding digits on the bits following the reference mantissa bit are set to be zero), and the erased floating-point value is input into the XOR-based compressor for XOR operation. At one hand, by erasing the mantissa bits following the reference mantissa bit, plenty tailing mantissa bits are set to be zero, so that an XORed result having plenty tailing zeros are obtained when XOR operation is performed on the erased floating-point value and its neighbor floating-point value. At another hand, the reference mantissa bit (the mantissa bits after which are erased) is determined based on the decimal place count and the digits on the exponent bits, and then only the mantissa bits following reference mantissa bit will be erased, and none of the sign bit and the exponent bits is erased, so that while ensuring that the XORed result has plenty tailing zeros, the compression-decompression precision are ensured, so that the effect of compressing floating-point values are improved. A new idea for compressing floating-point values without any precision loss is provided. In addition, embodiments of the present disclosure use the XORed result and the decimal place count of the floating-point value to form the lossless compressed data for recovering the floating-point value, or uses the XORed result and the modified decimal significand count of the floating-point value to form the lossless compressed data for recovering the floating-point value, so that during the later decompression, the XORed result is decompressed to obtain the mantissa prefix number, and the original floating-point value is recovered based on the mantissa prefix number and the decimal place count (the decimal place count is obtained from storage or is recovered from the stored modified decimal significand count), so that the decompression ratio and the decompression efficiency are further improved.

FIG. 5 illustrates the flow chart of an erasing-based lossless decompression method for floating-point values according to an embodiment of the present disclosure. The decompression method described herein may be based on the data compressed and stored according to the compression method described above. The erasing-based lossless compression method for floating-point values comprises following steps.

Step 1: acquiring the stored XORed result and the modified decimal significand count of a floating-point value; and Step 2: performing XOR operation on the XORed result and the mantissa prefix number of the previous floating-point value, to obtain the mantissa prefix number of the floating-point value.

In the embodiment, the stored XORed result and the modified decimal significand count of the floating-point value is obtained, from a storage where the XORed result and the modified decimal significand count of the floating-point value are stored. Then XOR operation is performed on the XORed result and the mantissa prefix number of the previous floating-point value. For example, the stored XORed result Δ' is "0 00000000000 0011010100000000000000000000000000000000000000 0000", and the mantissa prefix number of the previous floating-point value 3.25 is "0 10000000000 1010000000000000000000000000000000000000000000 0000", then the XOR operation is performed on the "0 00000000000011010100000000000000000000000000000 00000000000000000" and "0 10000000000 1010000000000000000000000000000000000000000000 0000", to obtain "0 10000000000 1001010100000000000000000000000000000000000000 0000" which is the mantissa prefix number of the original floating-point value 3.17.

Step 3: obtaining the decimal place count of the floating-point value.

In the embodiment, the decimal place count of the floating-point value is obtained, for recovering the original floating-point value.

In an alternative implementation of the embodiment, the decimal place count of the floating-point value may be obtained directly when the decimal place count was stored during the compression. Alternatively, the decimal place count of the floating-point value may be recovered from the modified decimal significand count which was stored during the compression.

In an alternative implementation of the embodiment, the recovering the decimal place count based on the decimal significand count may comprises: in response to determining that $\beta^*$ equals to zero, determining that $v=10^{-i}$, $i=SP(v')+1$; in response to determining that $\beta^*$ does not equal to zero, then assigning $\beta=\beta^*$, recovering the decimal place count of the floating-point value by, $$\alpha = \begin{cases} \beta - (SP(v') + 1) & v \neq 10^{-i}, i > 0 \\ \beta - (SP(v') + 2) & v = 10^{-i}, i > 0 \end{cases},$$

where $\alpha$ denotes the decimal place count of the floating-point value, v denotes the floating-point value, v' denotes the mantissa prefix number of the floating-point value v, SP(v') is start decimal significand position of the mantissa prefix number. In an alternative implementation, $SP(v')=\lfloor \log_{10}|v'| \rfloor$, the operator[x] denotes round x down. For example, for the original floating-point value 3.17, the stored modified decimal significand count is $\beta=\beta^*=3$, and the mantissa prefix number v' thereof is calculated as 3.1640625, then the decimal place count of the original floating-point value is then calculated as $\alpha=\beta-(SP(v')+1)=3-(\lfloor\log_{10}|3.1640625|\rfloor+1)=2$. Then, the decimal place count of the original floating-point value is recovered.

Step 3: recovering the floating-point value based on the mantissa prefix number of the floating-point value and the decimal place count of the floating-point value.

In the embodiment, the original floating-point value may be recovered based on the mantissa prefix number of the floating-point value and the decimal place count of the floating-point value.

In an alternative implementation of the embodiment, step 3 further comprises: transforming the mantissa prefix number of the floating-point value into decimal format; recovering the floating-point value by:

$$v = Leaveout(v', \alpha) + 10^{-\alpha}$$

where Leaveout(v', $\alpha$)=$(d_{h'-1}d_{h'-2} \ldots d_0 \cdot d_{-1}d_{-2} \ldots d_{-\alpha})_{10}$ is the operation that leaves out the digits after $d_{-\alpha}$ DF(v')= $(d_{h'-1}d_{h'-2} \ldots d_0 \cdot d_{-1}d_{-2} \ldots d_{-\alpha}d_{-(\alpha+1)} \ldots d_{l'})_{10}$, where v denotes the floating-point value, v' denotes the mantissa prefix number of the floating-point value, DF(v') is the mantissa prefix number in the decimal format, $d_i$ denotes a digit on the $i^{th}$ place in the mantissa prefix number in the decimal format.

For example, for the mantissa prefix number "0 10000000000100101010000000000000000000000000 00000 00000000000000" of the original floating-point value 3.17, transforming it into the decimal format to obtain a value of 3.1640625, the decimal place count of the original floating-point value is recovered as $\alpha=2$, then v=Leaveout (v', a)+$10^{-\alpha}$=3.16+$10^{-2}$=3.17. The original floating-point value is recovered without loss of precision.

In an alternative implementation of the embodiment, the equation v=Leaveout(v', $\alpha$)+$10^{-\alpha}$ may be implemented by v=Roundup(v', $\alpha$), where Roundup(v', $\alpha$) is the operation to round v' up to a decimal places.

According to the embodiment of the present disclosure, the stored XORed result is acquired and then the mantissa prefix number of the original floating-point value is recovered therefrom, and then the decimal place count of the original floating-point value is recovered, and the original floating-point value is recovered based on the mantissa prefix number and decimal place count of the original floating-point value, without any precision loss. The lossless decompression for the floating-point value is realized.

Figures 7, 8:
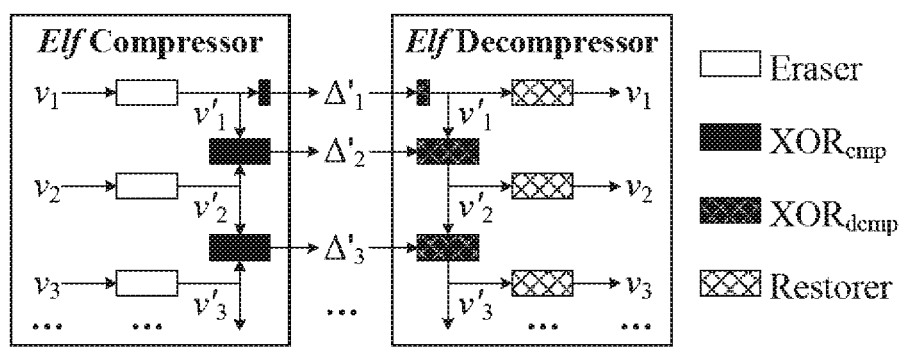
FIG. 7 is a schematic diagram of an application scenario of the Elf compression and decompression methods according to an embodiment of the present disclosure.
FIG. 8 illustrates examples of mantissa prefix number.

FIG. 7 is a schematic diagram of an application scenario of the Elf compression and decompression methods according to an embodiment of the present disclosure. As illustrated in FIG. 7, the above described erasing-based lossless compression and decompression methods for floating-point values may be applied to time series data. For the first value $v_1$, we leverage $\lceil \log_2 65 \rceil$=7 bits to record the number of trailing zeros trail of $v_1$' (note that trail can be assigned a total of 65 values from 0 to 64), and store $v_1$'s non-trailing bits with 64-trail bits. In all, we utilize 71-trail bits to record the first value, which is usually less than 64 bits. For each value $v_t$' that t>1, we store $xor_t \oplus v_t' \oplus v_{t-1}'$. The storage of the $xor_t=v_t' \oplus v_{t-1}'$ will be described in detail in following embodiments.

Following double floating-point data occupying 64 bits are taken as an example to explain the embodiments of the present disclosure in detail. The processing method for the single floating-point data is similar.

Definitions

For ease of explanation, following definitions are provided.

Definition 1: Decimal Format and Binary Format. The decimal format of a double value v is DF(v)=$\pm(d_{h-1}d_{h-2} \ldots d_0 \cdot d_{-1}d_{-2} \ldots d_l)_{10}$, where $d_i \in \{0,1, \ldots ,9\}$ for $1 \le i \le h-1$, $d_{h-1} \ne 0$ unless h=1, and $d_l \ne 0$ unless l=-1. That is, DF(v) would not start with "0" except that h=1, and would not end with "0" except that l=-1. Similarly, the binary format of v is BF(v)=$\pm(b_{\bar{h}-1}b_{\bar{h}-2} \ldots b_0 \cdot b_{-1}b_{-2} \ldots b_{\bar{l}})_2$, where $b_j \in \{0,1\}$ for $\bar{l} \le j \le \bar{h}-1$. Following relation holds:

$$v = \pm \sum_{i=l}^{h-1} d_i \times 10^i = \pm \sum_{j=\bar{l}}^{\bar{h}-1} b_j \times 2^j$$

where the "$\pm$" (which means "+" or "−") is the sign of v. If $v \ge 0$, "+" is usually omitted. For example, DF(0)=$(0.0)_{10}$, DF(5.2)=$(5.2)_{10}$, BF(−3.125)=−$(11.001)_2$.

Definition 2: Decimal Place Count, Decimal Significand Count and Start Decimal Significand Position. Given v with its decimal format DF(v)=$\pm(d_{h-1}d_{h-2} \ldots d_0 \cdot d_{-1}d_{-2} \ldots d_l)_{10}$, DP(v)=|l| is called its decimal place count. If for all $l < n \le h-1$, $d_i=0$ but $d_{n-1} \ne 0$ (i.e., $d_{n-1}$ is the first digit that is not equal to 0), SP(v)=n−1 is called the start decimal significand position, and DS(v)=n−l−1=SP(v)+l−1 is called the decimal significand count. For the case of v=0, we let DS(v)=0 and SP(v)=undefined.

For example, DP(3.14)=2, DS(3.14)=3, and SP(3.14)=0; DP(−0.0314)=4, DS(−0.0314)=3, and SP(−0.0314)=−2; DP(314.0)=1, DS(314.0)=4, and SP(314.0)=2.

As illustrated in FIG. 4, In accordance with IEEE 754 Standard, a double value v is stored with 64 binary bits, where 1 bit is for the sign s, 11 bits for the exponent $\vec{e}=<e_1, e_2, \ldots, e_{11}>$, and 52 bits for the mantissa $\vec{m}=<m_1, m_2, \ldots, m_{52}>$. Normal numbers are the most cases of time series data. If v is a normal number, its value satisfies:

$$v = (-1)^s \times 2^{e-1023} \times \left(1 + \sum_{i=1}^{52} m_i \times 2^{-i}\right)$$

$$e = (e_1 e_2 \ldots e_{11})_2 = \sum_{i=1}^{11} e^i \times 2^{11-i}$$

where v denotes the floating-point value, $m_i$ denotes a digit on the $i^{th}$ mantissa bit in the mantissa bits of the floating-point value, and $e_i$ denotes a digit on the $i^{th}$ exponent bit in the exponent bits of the floating-point value. If let $m_0=1$ and BF(v)=$\pm(b_{\bar{h}-1}b_{\bar{h}-2} \ldots b_0 \cdot b_{-1}b_{-2} \ldots b_{\bar{l}})_2$, we have $b_{-i}=m_{i+e-1023}$, i>0.

As illustrated in FIG. 4, in the mantissa $\vec{m}=<m_1, m_2, \ldots, m_{52}>$ of a double value v, $m_i$ is more significant than $m_j$ for $1 \le i \le j \le 52$, since $m_i$ contributes more to the value v than $m_j$.

The main idea of the Erasing-based Lossless Floating-point (Elf) compression described herein is to erase some less significant mantissa bits (i.e., set them to zeros) of a double value v. As a result, v itself and the XORed result of v with its previous value are expected to have many trailing zeros. Note that v and its opposite number—v have the same double-precision floating-point formats except the different values of their signs. That is to say, the compression process for—v can be converted into the one for v if we reverse its sign bit only, and vice versa. To this end, in the rest of the disclosure, if not specified, v is assumed to be positive for the convenience of description. Before introducing the details of Elf compression, we first give the definition of mantissa prefix number.

Definition 3: Mantissa Prefix Number. Given a double value v with $\vec{m}=\langle m_1, m_2, \ldots, m_{52}\rangle$, the double value v' with $\vec{m}'=\langle m'_1, m'_2, \ldots, m'_{52}\rangle$ is called the mantissa prefix number of v if and only if there exists a number $n \in \{1,2,\ldots,51\}$ such that $m'_i=m_i$ for $1 \leq i \leq n$ and $m'_j=0$ for $n+1 \leq j \leq 52$, denoted as v'=MPN(v, n).

The definition of Mantissa Prefix Number is proposed firstly in embodiments of the present disclosure.

For example, as shown in FIG. 8, four mantissa prefix numbers of 3.17 are given as examples, i.e., 3.17=MPN(3.17,50), 3.169999837875366=MPN(3.17,23), 3.1640625=MPN(3.17,8), 3.125=MPN(3.17,4).

Observation:

The erasing-based lossless compression method for floating-point values described in embodiments of the present disclosure is based on the following observation: given a double value v with its decimal format $DF(v)=(d_{h-1} d_{h-2} \ldots d_0 . d_{-1} d_{-2} \ldots d_l)_{10}$, we can find one of its mantissa prefix numbers v' and a minor double value δ, $0 \leq \delta \leq 10^l$, such that v'=v−δ. If the information of v' and δ are retained, v cloud be recovered without losing any precision. The parameter δ is proposed herein for ease of understanding the compression and decompression methods described herein, and the accurate value of δ is not required to be calculated. Then during recovering the original floating-point value v, it is not required to find the accurate value of δ, we just need to round v' up to a decimal places and then plus $10^{-\alpha}$. For example, when α=DP(v)=DP(3.17)=2, v'=3.1640625, then v=RoundUp(v', a)=$(3.16)_{10}+10^{-2}$=3.17. In an example, the v=RoundPp(v', α) could also be implemented by Leaveout (v', a)=$(d'_{h-1}d'_{h-2} \ldots d_0 . d_{-1} d_{-2} \ldots d_{-a})_{10}$, which leaves out the digits after $d_{-\alpha}$ in $DF(v')=(d'_{h-1}d'_{h-2} \ldots d_0 . d_{-1} d_{-2} \ldots d_{-\alpha} d_{-(\alpha+1)} \ldots d_l)_{10}$.

FIG. 8 illustrates examples of mantissa prefix number. From FIG. 8 it is noted that 3.1640625 has more trailing zeros than 3.169999837875366 and 3.17, the mantissa prefix number 3.1640625 is the most suitable v'.

There are two problems here. Problem I: how to find the best mantissa prefix number v' of v with the minimum efforts; Problem II: how to store the decimal place count α with the minimum storage cost?

Mantissa Prefix Number Search:

For the problem I: It is time consuming to iteratively check all mantissa prefix number v' until δ=v−v' is greater than $10^{-\alpha}$, it needs to verify the mantissa prefix numbers at most 52 times in the worst case. A novel mantissa prefix number search method is proposed herein.

Theorems are proposed herein for ease of explaining the mantissa prefix number search method.

Theorem 1: Given a double value v with its decimal place count DP(v)=a and binary format $BF(v)=(b_{\bar{h}-1}b_{\bar{h}-2} \ldots b_0 . b_{-1}b_{-2} \ldots b_{\bar{l}})_2$, $\delta=(0.0 \ldots 0b_{-(f(\alpha)+1)}b_{-(f(\alpha)+2)} \ldots b_{\bar{l}})_2$ is smaller than $10^{-\alpha}$, where $f(\alpha)=\lceil \log_2 10^{-\alpha} \rceil = \lceil |\alpha \times \log_2 10| \rceil$.

Proof:

$$\delta = \sum_{i=f(\alpha)+1}^{|\bar{l}|} b_i \times 2^{-i} \leq \sum_{i=f(\alpha)+1}^{|\bar{l}|} 2^{-i} < \sum_{i=f(\alpha)+1}^{+\infty} 2^{-i}$$

-continued
$$= 2^{-f(\alpha)} = 2^{-\lceil \alpha \times \log_2 10 \rceil} \leq 2^{-\alpha \times \log_2 10}$$
$$= (2^{\log_2 10})^{-\alpha} = 10^{-\alpha}$$

Here, $f(\alpha)=\lceil |\log_2 10^{-\alpha}| \rceil$ means that the decimal value $10^{-\alpha}$ requires exactly $\lceil |\log_2 10^{-\alpha}| \rceil$ binary bits to represent. Suppose δ is obtained based on Theorem 1, v−δ can be regarded as erasing the bits after $b_{-f(\alpha)}$ in Vs binary format. In accordance with IEEE 754 Standard and recall that the $b_{-i}=m_{i+e-1023}$ in BF(v) where i>0 described above, a corresponding $m_{i+e-1023}$ can be found. Consequently, v−δ can be further deemed as erasing the mantissa bits after $m_{g(\alpha)}$ in Vs underlying floating-point format, in which g(α) is defined as:

$$g(\alpha) = f(\alpha) + e - 1023 = \lceil \alpha \times \log_2 10 \rceil + e - 1023$$

where α=DP(v) and $e=(e_1 e_2 \ldots e_{11})_2 = \sum_{i=1}^{11} e_i \times 2^{11-i}$.

As a result, we can directly calculate the best mantissa prefix number v' by simply erasing the mantissa bits after $m_{g(\alpha)}$ of v, which takes only O(1).

Decimal Place Count Calculation:

For the problem II, if it is directly the decimal place count a stored, it would require $\lceil \log_2 \alpha_{max} \rceil$ bit for a storage, where $\alpha_{max}$ is the possible maximum value of a decimal place count. The minimum value of the double-precision floating-point number is about $4.9 \times 10^{-314}$, so $\alpha_{max}$=324 and $\lceil \log_2 \alpha_{max} \rceil$=9, i.e., it would require as many as 9 bits to store α during compression process for each double value. Thus, to further reduce the storage cost and improve the compression ratio, we may store the modified decimal significand count of the floating-point value instead.

Given v with its decimal format $DF(v)=(d_{h-1}d_{h-2} \ldots d_0 . d_{-1}d_{-2} \ldots d_l)_{10}$, we notice that its decimal place count α=DP(v) can be calculated by the decimal significand count β=DS(v). Since the decimal significand count of a double value would not be greater than 17 under the IEEE 754 Standard, it requires much fewer bits to store β. According to the above Definition 2, we have α=DP(v)=|l|=−l and β=DS(v)=SP(v)+l−1, so we have:

$$\alpha = \beta - (SP(v) + 1)$$

Next, we discuss how to get SP(v) without even knowing v. Two additional Theorems are proposed. The additional theorems are proposed according to the structure of double floating-point value.

Theorem 2: Given a double value v and its best mantissa prefix number v', if $v \neq 10^{-i}$, i>0, then SP(v)=SP(v').

Theorem 3: Given a double value v=$10^{-i}$, i>0, and its best mantissa prefix number v', we have SP(v)=SP(v')+1.

According to Theorem 2 and Theorem 3, we have:

$$\alpha = \begin{cases} \beta - (SP(v') + 1) & v \neq 10^{-i}, i > 0 \\ \beta - (SP(v') + 2) & v = 10^{-i}, i > 0 \end{cases}$$

For any normal number v, its decimal significand count $\beta$ will not be zero. Besides, if we know $v=10^{-SP(v)}$, we can easily get v from v' by the following equation:

$$v = 10^{-(SP(v')+1)}$$

To this end, we can record a modified decimal significand count $\beta^*$ for the calculation of $\alpha$.

$$\beta^* = DS^*(v) = \begin{cases} 0 & v = 10^{-i}, i > 0 \\ \beta & \text{others} \end{cases}$$

where $\beta^*$ denotes the modified decimal significand count of the floating-point value, and $\beta$ denotes a decimal significand count of the floating-point value, SP(v') denotes the start decimal significand position of v'.

Although there are 18 possible values of $\beta^*$, i.e., $\beta^* \in \{0, 1, 2, \ldots, 17\}$, we do not consider the situations when $\beta^*=16$ or 17, because for these two situations, we can only erase a small number of bits but need more bits to record $\beta^*$. For example, given v=3.141592653589792 with $\beta=16$, we can erase one bit only. Thus, the erasing operation may be performed when it determined that $\beta^*<16$.

In an alternative implementation, since 4 bits is leveraged to record $\beta^*$ for $0 \leq \beta^* < 15$, the erasing operation is performed only when $52-g(\alpha)>4$. When $52-g(\alpha) \leq 4$, which means the mantissa bits to be erased is less than 4, we may do not perform the earing operation.

In an alternative implementation, when $\delta=0$, it indicates that v itself has long trailing zeros. Once $\delta=0$, we may do not perform the erasing operation. We may get $\delta$ by extracting the least $52-g(\alpha)$ significant mantissa bits of v, to determine if $\delta=0$.

Implementations of present disclosure store the modified decimal significand count $\beta^*$ instead of the decimal place count, the storage space required is reduced hugely compared with directly storing the decimal place count.

Normal Numbers and Special Numbers:

Normal numbers are the most cases of time series data, and the erasing operation in the above described compression and decompression methods are applicable to normal numbers. However, the erasing operation described above is tailored for the special numbers.

There are four types of special number:
(1) Zero. The digits on the exponent bits and the digits on the mantissa bits are all "0".
(2) Infinity. The digits on the exponent bits are all "1" and the digits on the mantissa bits are all "0".
(3) NaN. The digits on the exponent bits are all "1" and the digits on the mantissa bits includes "0" and "1".
(4) Subnormal Number. The digits on the exponent bits are all "0" and the digits on the mantissa bits includes "0" and "1". In this case, the following equation holds:

$$v = (-1)^s \times 2^{-1022} \times (0, m_1 m_2 \ldots m_{52})_2$$
$$= (-1)^s \times 2^{-1022} \times \sum_{i=1}^{52} m_i \times 2^{-i}.$$

The above erasing operation are tailored for the special numbers by:

(1) for Zero and Infinity: if v is a zero or infinity, erasing operation will not be performed on v because all its mantissa bits are already zero.
(2) for NaN: if v is a NaN, in order to make its trailing zeros as many as possible, we perform $NaN_{norm}$ operation on it, which sets $m_1=1$ and $m_i=0$ for $i \in \{2,3,\ldots,52\}$, i.e., $$v' = NaN_{norm}(v) = 0xfff8000000000000L \& v.$$

(3) for Subnormal Number: subnormal numbers can be regarded as the special cases of normal numbers by setting e=1 and $m_0=0$. As a result, the subnormal numbers can be compressed in the same way of normal numbers.

Significand Count Encoding Strategy:

According to yet another embodiment of the present disclose, a method for storing the modified decimal significand count of the floating-point value is provided. The method for storing the modified decimal significand count of the floating-point value includes: in response to determining that the condition $C_1$ is satisfied, writing a first flag code (e.g., one bit of "1") to indicate performing the erasing operation, and writing 4 bits of $\beta^*$ following the first flag code; in response to determining that the condition $C_1$ is not satisfied, writing a second flag code (e.g., one bit of "0") to indicate not performing the erasing operation. The condition $C_1$ is satisfied when $\delta \neq 0$ (i.e., a digit on a mantissa bit following the reference mantissa bit is not zero) and/or $\beta^*<16$, and/or $52-g(\alpha)>4$. For example, the condition $C_1$ is satisfied when it is determined that $\delta \neq 0$. For example, the condition $C_1$ is satisfied when it is determined that $\delta \neq 0$ and $\beta^*<16$. For example, the condition $C_1$ is satisfied when it is determined that $\delta \neq 0$ and $52-g(\alpha)>4$. For another example, the condition $C_1$ is satisfied when it is determined that $\delta \neq 0$ and $\beta^*<16$ and $52-g(\alpha)>4$. An alternative implementation of storing the modified decimal significand count $\beta^*$ is described in FIG. 9a. When the erasing operation is performed in response to $\delta \neq 0$ and $52-g(\alpha)>4$, a positive gain on compression ratio may be ensured while ensuring the lossless compression on floating-point value. When the erasing operation is performed in response to $\delta \neq 0$ and $\beta^*<16$, a positive gain on compression ratio may be ensured while ensuring the lossless compression on floating-point value.

Figure 9A:
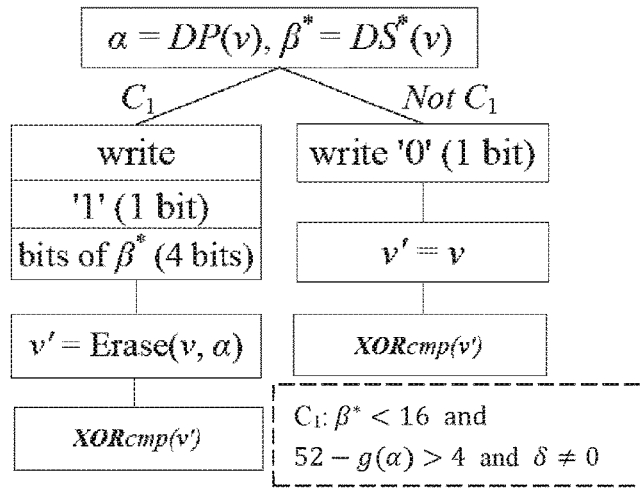
FIG. 9a is schematic diagram of an encoding strategy for the significand count according to an embodiment of the present disclosure.

In an alternative implementation, given a floating-point value v, when it is determined that the above condition $C_1$ is satisfied, the out stream writes a first flag code (e.g., one bit of "1") to indicate that v should be transformed to v' by erasing the least $52-g_{(\alpha)}$ significant mantissa bits of v, followed by 4 bits of $\beta^*$ for the recovery of v. Otherwise, the out stream writes a second flag code (e.g., one bit of "0"), and v' is assigned v without any modification. Finally, the obtained v' is passed to the XOR-based compressor (i.e., the XORcmp illustrated in FIG. 9a) together with the first or second flag code for further compression. The encoding strategy illustrated in FIG. 9a are just alternative examples, any other encoding strategy (such as using the flag code "0" for the case "$C_1$" and using flag code "1" for the case "Not $C_1$", etc.) which can also arrive the same effect could also be used herein.

In an alternative implementation, when it is determined that $\delta \neq 0$ and $\beta^*<16$ and $52-g(\alpha)>4$ hold simultaneously, the out stream writes a first flag code (e.g., one bit of "1") to indicate that v should be transformed to v' by erasing the least $52-g(\alpha)$ significant mantissa bits of v, followed by 4 bits of $\beta^*$ for the recovery of v. Otherwise, the out stream writes a second flag code (e.g., one bit of "0"), and v' is assigned v without any modification. Finally, the obtained v' is passed to the XOR-based compressor together with the first or second flag code for further compression.

The values in a time series usually have similar significand counts. Therefore, their modified significand counts are also similar. In the method described above, if a value v is to be erased, we always use four bits to record its $\beta^*$, which consumes storage spaces. An embodiment of the present disclosure proposes to make the utmost of the modified significand count of the previous one value $\beta^*_{pre}$, which is not only suitable for streaming scenarios and adaptive to dynamic significand counts, but also retains the characteristics of lossless compression. The intuition behind this is that the modified significand count of each value in a time series is likely to be exactly the same as that of the previous value. An alternative implementation of storing the $\beta^*$ by make the utmost of $\beta^*_{pre}$ is described in FIG. 9b.

Figure 9B:
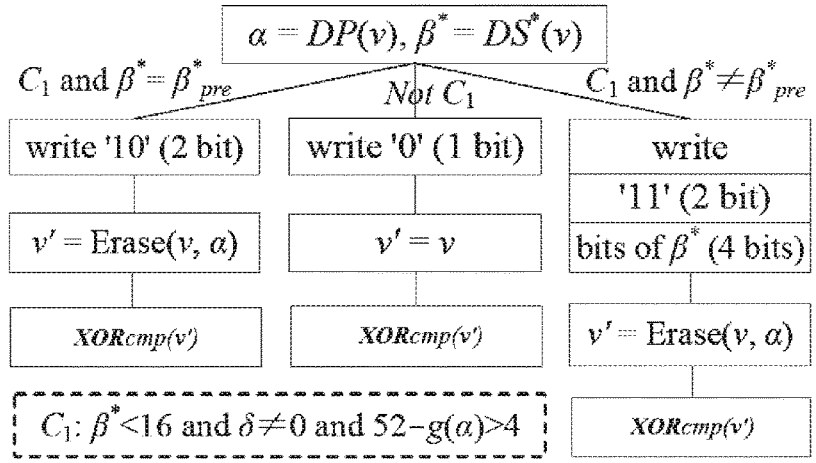
FIG. 9b is schematic diagram of an encoding strategy for the significand count according to another embodiment of the present disclosure.

As illustrated in FIG. 9b, an example of storing the modified decimal significand count of the floating-point value may comprise: in response to determining that the condition $C_1$ is satisfied and $\beta^*=\beta^*_{pre}$, writing a third flag code (e.g. one bit of "1" to indicate $C_1$ is satisfied and followed by one more bit of "0" to indicate $\beta^*=\beta^*_{pre}$) to indicate performing the erasing operation and that $\beta^*$ is identical to $\beta^*_{pre}$; in response to determining that $C_1$ is satisfied and $\beta^*\neq\beta^*_{pre}$, writing a fourth flag code (e.g. one bit of "1" to indicate that $C_1$ is satisfied and followed by one more bit of "1" to indicate $\beta^*\neq\beta^*_{pre}$) to indicate performing the erasing operation and that $\beta^*$ is not identical to $\beta^*_{pre}$, and writing 4 bits of $\beta^*$ following the flag code; in response to determining that $C_1$ is not satisfied, writing a second flag code (e.g., one bit of "0" to indicate that v'=v) to indicate not performing the erasing operation. The condition $C_1$ herein refers to, for example, the condition $C_1$ is satisfied when it is determined that $\beta^*<16$ and $52-g(\alpha)>4$ and $\delta\neq0$. Here, $\beta^*$ denotes the modified decimal significand count of the floating-point value, and $\beta^*_{pre}$ denotes the modified decimal significand count of the previous floating-point value. Finally, the obtained v' is passed to the XOR-based compressor together with the second, third or fourth flag code for further compression. The encoding strategy illustrated in FIG. 9b are just alternative examples, any other encoding strategy (such as using the flag code "01" for the case "$C_1$ and $\beta^*=\beta^*_{pre}$" and using flag code "1" for the case "Not $C_1$", and using flag code "00" for the case "$C_1$ and $\beta^*\neq\beta^*_{pre}$", etc.) which can also arrive the same effect could also be used herein.

We notice that the case of "$C_1$ and $\beta^*=\beta^*_{pre}$" has the largest proportion among the three cases illustrated in FIG. 9b for almost all datasets, but we use 2 bits (e.g., the flag code '10') to represent this case. In order to encode the more frequent cases with fewer bits, we propose herein to switch the flag codes (e.g., '10' and '0') of case "$C_1$ and $\beta^*=\beta^*_{pre}$" and case "Not $C_1$" in FIG. 9(b). Finally, an alternative implantation of storing the modified decimal significand count $\beta^*$ is transformed into the one shown in FIG. 9c.

Figure 9C:
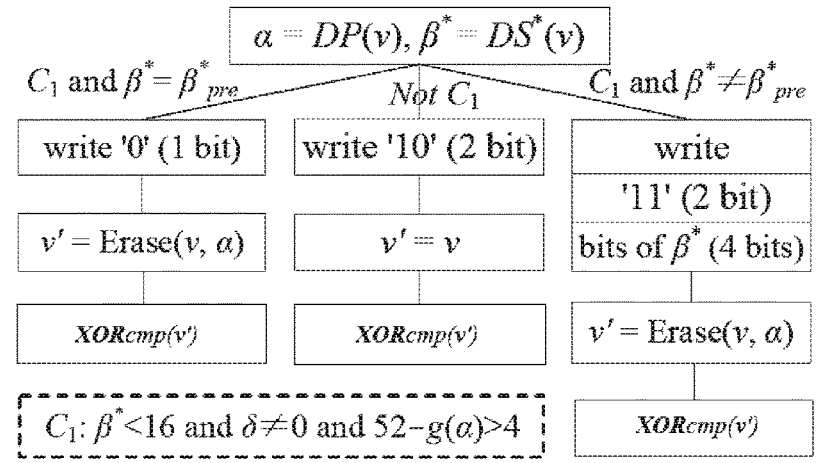
FIG. 9c is schematic diagram of an encoding strategy for the significand count according to yet another embodiment of the present disclosure.

As illustrated in FIG. 9c, an example of storing the modified decimal significand count $\beta^*$ of the floating-point value may comprise: in response to determining that the condition $C_1$ is satisfied and $\beta^*=\beta^*_{pre}$, writing a second flag code (e.g. one bit of '0') to indicate performing the erasing operation and that $\beta^*$ is identical to $\beta^*_{pre}$; in response to determining that $C_1$ is satisfied and $\beta^*\neq\beta^*_{pre}$, writing a fourth flag code (e.g. two bits of '11') to indicate performing the erasing operation and that $\beta^*$ is not identical to $\beta^*_{pre}$, and writing 4 bits of $\beta^*$ following the flag code; in response to determining that $C_1$ is not satisfied, writing a third flag code (e.g., two bits of '10') to indicate not performing the erasing operation. The condition $C_1$ is satisfied herein, for example, when it is determined that $\beta^*<16$ and $52-g(\alpha)>4$ and $\delta\neq0$. Here, $\beta^*$ denotes the modified decimal significand count of the floating-point value, and $\beta^*_{pre}$ denotes the modified decimal significand count of the previous floating-point value. Finally, the obtained v' is passed to the XOR-based compressor together with the second, third or fourth flag code for further compression. The encoding strategy illustrated in FIG. 9c are just alternative examples, any other encoding strategy (such as using the flag code "1" for the case "$C_1$ and $\beta^*=\beta^*_{pre}$" and using flag code "01" for the case "Not $C_1$", and using flag code "10" for the case "$C_1$ and $\beta^*\neq\beta^*_{pre}$", etc.) which can also arrive the same effect could also be used herein.

An example algorithm for realizing the Elf+ compression corresponding to FIG. 9c is listed below.

```
Algorithm : ElfPlusEraser(υ, out)
1   α ← DP(υ), β* ← DS*(υ);
2   δ ← ~(0xffffffffffffffffL << (52 − g(α))) & υ;
3   if β* < 16 and δ ≠ 0 and 52 − g(α) > 4 then
4   |    if β* = β*_pre then
5   |    |_ out.writeBit("0");
6   |    else
7   |    |    out.writeBit("11"); out.write(β*,4);
8   |    |_   β*_pre ← β*;
9   |_   υ' ← (0xffffffffffffffffL << (52 − g(α))) & υ;
10  else
11  |_   out.writeBit("10"); υ' ← υ;
12  XOR_cmp(υ',out);
```

The above algorithm presents Elf+ compression method, which is similar to the Elf compression method except two aspects. (1) We further check if $\beta^*=\beta^*_{pre}$ when v is to be erased (Lines 4-9). If $\beta^*=\beta^*_{pre}$, we only write one bit of '0'. Otherwise, we write two bits of '11' and four bits of $\beta^*$. Moreover, we assign $\beta^*$ to $\beta^*_{pre}$ for the compression of the next value (Line 8). (2) The flag codes are different from those in Elf compression. For example, in Elf compression, we use one bit of '0' to indicate the case that v would not be erased, but in Elf+ compression we leverage two bits of '10' for this case (Line 11).

Here, each of the first, second, third, and fourth flag codes may occupy one or two bits.

When $\beta^*$ is stored according to the encoding strategy illustrated in FIG. 9a, an alternative implementation of recovering the original floating-point value may include: reading a flag code and determining whether the flag code is the first or second flag code; in response to determining that the flag code is the second flag code (e.g., one bit of '0'), assigning v=v'; in response to determining that the flag code is the first flag code (e.g., one bit of '1'), getting the $\beta^*$ by reading the 4 bits of $\beta^*$; performing XOR operation on the XORed result and the mantissa prefix number of the previous floating-point value, to obtain the mantissa prefix number v' of the floating-point value v; calculating the decimal place count of the floating-point value v based on the modified decimal significand count $\beta^*$ of the floating-point value v; and recovering the floating-point value based on the mantissa prefix number of the floating-point value and the decimal place count of the floating-point value.

When $\beta^*$ is stored according to the storing method illustrated in FIG. 9b, an alternative implementation of recovering the original floating-point value may include: reading a flag code and determining whether the flag code is the second, third, or fourth flag code; in response to determining that the flag code is the second flag code (e.g., one bit of '0'), assigning v'=v; in response to determining that the flag code is the third flag code (e.g., two bits of '10'), assigning $\beta^*=\beta^*_{pre}$; in response to determining that the flag code is the fourth flag code (e.g. two bits of '11'), getting the $\beta^*$ by reading the 4 bits of $\beta^*$; performing XOR operation on the XORed result and the mantissa prefix number of the previous floating-point value, to obtain the mantissa prefix number of the floating-point value; calculating the decimal place count of the floating-point value based on the modified decimal significand count of the floating-point value; and recovering the floating-point value based on the mantissa prefix number of the floating-point value and the decimal place count of the floating-point value.

When $\beta^*$ is stored according to the storing method illustrated in FIG. 9c, an alternative implementation of recovering the original floating-point value may include: reading a flag code and determining whether the flag code is the second, third, or fourth flag code; in response to determining that the flag code is the third flag code (e.g., two bits of '10'), assigning v'=v; in response to determining that the flag code is the second flag code (e.g. one bit of '0'), assigning $\beta^*=\beta^*_{pre}$; in response to determining that the flag code is the fourth flag code, getting the $\beta^*$ by reading the 4 bits of $\beta^*$; performing XOR operation on the XORed result and the mantissa prefix number of the previous floating-point value, to obtain the mantissa prefix number of the floating-point value; calculating the decimal place count of the floating-point value based on the modified decimal significand count of the floating-point value; and recovering the floating-point value based on the mantissa prefix number of the floating-point value and the decimal place count of the floating-point value.

An example algorithm for realizing recovering the original floating-point value corresponding to the Elf+ compression of FIG. 9c is listed below:

| | Algorithm : ElfPlusRestorer(in) |
|---|---|
| 1 | if in.read(1) = 0 then |
| 2 |      $\beta^* \leftarrow \beta^*_{pre}$; $v' \leftarrow XOR_{dcmp}$(in); |
| 3 |     \|_ $v \leftarrow$ restore($\beta^*$, $v'$); |
| 4 | else if in.read(1) = 0 then |
| 5 |     \|_ $v \leftarrow XOR_{dcmp}$(in); |
| 6 | else |
| 7 |      $\beta^* \leftarrow$ in.read(4); $v' \leftarrow XOR_{dcmp}$(in); |
| 8 |     \|_ $v \leftarrow$ restore($\beta^*$, $v'$); $\beta^*_{pre} \leftarrow \beta^*$; |
| 9 | return $v$; |
| 10 | Function restore($\beta^*$, $v'$) |
| 11 |     if $\beta^* = 0$ then |
| 12 |         \|_ $v \leftarrow 10^{-(SP(v')+1)}$; |
| 13 |     else |
| 14 |          $\alpha \leftarrow \beta^* - (SP(v') + 1)$; |
| 15 |          $v \leftarrow$ LeaveOut($v',\alpha$) + $10^{-\alpha}$; |
| 16 | \|_ return $v$; |

Significand Count Calculation:

The naive method for calculating the significand counts of floating-point values is to first transform a floating-point value into a string, and then calculate its significand count by scanning the string. However, this method runs very slowly since the data type transformation is quite expensive. Other methods, such as BigDecimal in Java language perform even worse as these high-level classes implement many complex but unnecessary logics, which are not suitable for the calculation of significand counts.

In an alternative implementation, a trial-and-error approach is proposed herein to calculate the significand count. In particular, for any one of the above described compression methods, we iteratively check if the condition "$v \times 10^i = \lfloor v \times 10^i \rfloor$" holds (only when the result of $v \times 10^i$ does not have the fractional part, does the condition hold), where i is sequentially from sp* to at most sp*+17 (note that the maximum significand count of a double value is 17). Here, sp* is calculated by:

$$sp^* = \begin{cases} 1 & SP(v) \geq 0 \\ -SP(v) & SP(v) < 0 \end{cases}$$

The value i (denoted as i*) that first makes the equation "$v \times 10^i = \lfloor v \times 10^i \rfloor$" hold can be deemed as the decimal place count $\alpha$. At last, we can get the significand count $\beta = i^* + SP(v) + 1$ according to the equation $\alpha = \beta - (SP(v)+1)$.

The verification of the condition "$v \times 10^i = \lfloor v \times 10^i \rfloor$" is expected to take $O(\beta)$ in terms of time complexity. To expedite this process, we may take full advantage of the fact that most values in a time series have the same significand count. We may start the verification at i=max ($\beta^*_{pre}-SP(v)-1,1$). There are two cases. Case 1: $\beta^* \leq \beta^*_{pre}$. For this case, if "$v \times 10^i = \lfloor v \times 10^i \rfloor$" does not hold, we may repetitively increase i by 1 until the condition is satisfied. Case 2: $\beta^* > \beta^*_p$. For this case, we should constantly adjust i by decreasing it until the condition "i>1 and $v \times 10^{i-1} = \lfloor v \times 10^{i-1} \rfloor$" does not hold. Finally, the significand count is obtained and returned according to the equation $\alpha = \beta - (SP(v)+1)$.

Start Position Calculation:

In an alternative implementation, we may leverage two sorted exponential arrays, i.e., Log Arr1=$\{10^0, 10^1, \ldots, 10^i, \ldots\}$ and Log Arr2=$\{10^0, 10^{-1}, \ldots, 10^{-j}, \ldots\}$, to accelerate the process to find SP(v). Particularly, we sequentially scan these two arrays firstly. If $v \geq 1$ and $10^i \leq v \leq 10^{i+1}$ then SP(v)=i; if v<1 and $10^{-i} \leq v \leq 10^{-(j-1)}$, then SP(v)=-j. In an alternative implementation, we may set |Log Arr1|=|Log Arr2|=10. If $v \geq 10^{10}$ or $v \leq 10^{-10}$, we may call $\lfloor \log_{10}|v| \rfloor$ to get SP(v) finally (i.e., SP(v)=$\lfloor \log_{10}|v| \rfloor$). This alternative implementation reduce the time consumed during calculation the start position SP(v).

XORcmp and XORdcmp:

Theoretically, any existing XOR-based compressor such as Gorilla and Chimp mentioned above can be utilized in Elf. Since the erased value v' tends to contain long trailing zeros, to compress the time series compactly, in this section, we propose a novel XOR-based compressor and the correspond decompressor. In an embodiment, both Elf and Elf+ use the same XORcmp and XORdcmp.

Elf XORcmp: existing XOR-based compressors store the first value $v_1'$ of a time series using 64 bits. However, after being erased some insignificant mantissa bits, $v_1'$ tends to have a large number of trailing zeros. As a result, we leverage $\lceil \log_2 65 \rceil = 7$ bits to record the number of trailing zeros trail of $v_1'$ (note that trail can be assigned a total of 65 values from 0 to 64), and store $v_1$'s non-trailing bits with 64-trail bits. In all, we may utilize 71-trail bits to record the first value, which is usually less than 64 bits. For each value $v_t'$ that t>1, we store $xor_t = v_t' \oplus v_{t-1}'$.

Gorilla Compressor Gorilla compressor checks whether $xor_t$ is equal to 0 or not. If $xor_t=0$ (i.e., $v_t'=v_{t-1}'$), Gorilla writes one bit of "0", and thus it can save many bits without actually storing $v_t'$. If $xor_t \neq 0$, Gorilla writes one bit of "1" and further checks whether the condition $C_1$ is satisfied. Here $C_1$ is "lead$_t \geq$lead$_{t-1}$ and "trail$_t \geq$trail$_{t-1}$", meaning that the leading zeros count and trailing zeros count of $xor_t$ are greater than or equal to those of $xor_{t-1}$, respectively. If $C_1$ does not hold, after writing a bit of "1", Gorilla stores the leading zeros count and center bits count with 5 bits and 6 bits respectively, followed by the actual center bits. Otherwise, $xor_t$ shares the information of leading zeros count and center bits count with $xor_{t-1}$, which is expected to save some bits.

Figure 10A:
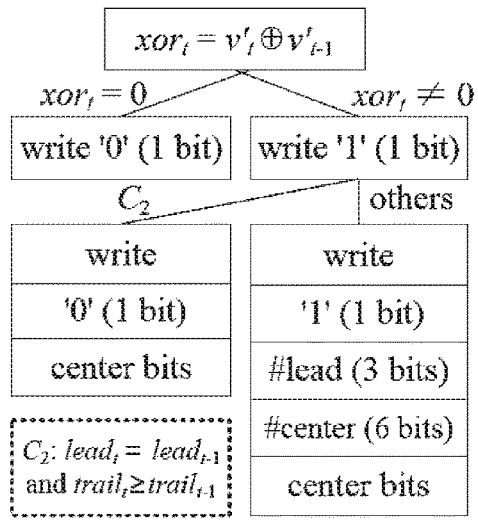
FIG. 10a is schematic diagram of an encoding strategy for the XORed result according to an embodiment of the present disclosure.

Leading Code Optimization: Observing that the leading zeros count of an XORed value is rarely more than 30 or less than 8, only $\log_2 8=3$ bits may be used to represent up to 24 leading zeros. In particular, 8 exponentially decaying steps (i.e., 0, 8, 12, 16, 18, 20, 22, 24) may be used to approximately represent the leading zeros count. If the actual leading zeros count is between 0 and 7, it can be approximated to be 0; if the actual leading zeros count is between 8 and 11, it can be approximated to be 8; and if the actual leading zeros count is between 12 and 15, it can be approximated to be 12; if the actual leading zeros count is between 16 and 17, it can be approximated to be 16; if the actual leading zeros count is between 18 and 19, it can be approximated to be 18; if the actual leading zeros count is between 20 and 21, it can be approximated to be 20; if the actual leading zeros count is between 22 and 23, it can be approximated to be 22; if the actual leading zeros count is 24, it can be approximated to be 24. The condition of $C_1$ is therefore converted into $C_2$, i.e., "$lead_t=lead_{t-1}$ and $trail_t trail_{t-1}$". By applying this optimization to Gorilla compressor, we can get a compressor shown in FIG. 10a. The encoding strategy (such as the flag code "0" for the case $xor_t=0$ and the flag code for the case $xor_t \neq 0$) illustrated in FIG. 10a are just alternative examples, any other encoding strategy (such as switching the flag code "0" and "1" for the cases $xor_t=0$ and $xor_t \neq 0$, etc.) which can also arrive the same effect could also be used herein.

Figure 10B:
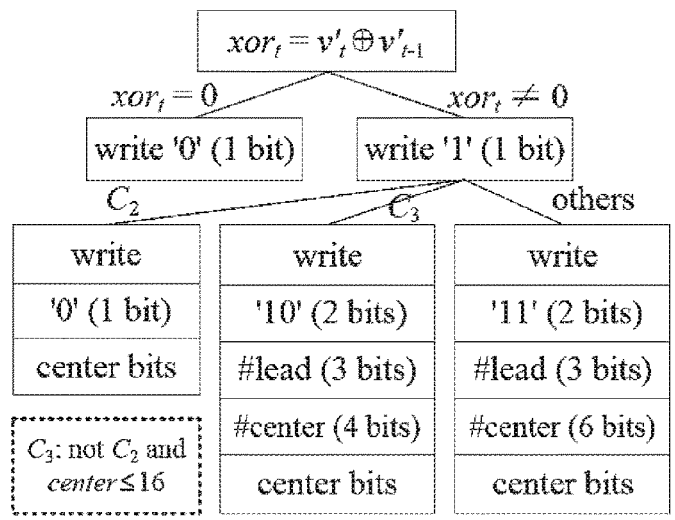
FIG. 10b is schematic diagram of an encoding strategy for the XORed result according to another embodiment of the present disclosure.

Center Code Optimization: both $v_t'$ and $v_{t-1}'$ are supposed to have many trailing zeros, which results in an XORed value with long trailing zeros. Besides, $v_t'$ would not differentiate much from $v_{t-1}'$ in most cases, contributing to long leading zeros in the XORed value. That is, the XORed value tends to have a small number of center bits (usually not more than 16). To this end, if the center bits count is less than or equal to 16, we use only $\log_2 16=4$ bits to encode it. Although we need one more flag bit, we can usually save one bit in comparison with the original solution. After optimizing the center code, an example compressor as shown in FIG. 10b is obtained. The encoding strategy illustrated in FIG. 10b are just alternative examples, any other encoding strategy (such as switching the flag code "0" and "1" for the cases $xor_t=0$ and $xor_t \neq 0$, and/or using flag code "1" for the case $C_2$, using flag code "01" for the case $C_3$ and using flag code "00" for other cases, etc.) which can also arrive the same effect could also be used herein.

Flag Code Reassignment: FIG. 10b shows that we use only 1 flag bit for the case of $xor_t=0$, but 2 or 3 flag bits for the cases of $xor_t \neq 0$. However, since identical consecutive values are not very frequent in floating-point time series, to further improve the compression ratio, we may reassign the flag codes to the four cases. Therefore, each case uses only 2 bits of flag, as illustrated in FIG. 10c.

Figure 10C:
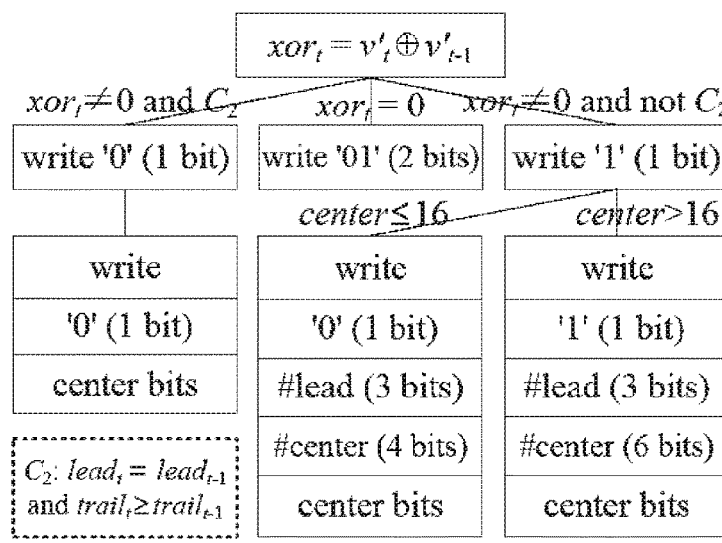
FIG. 10c is schematic diagram of an encoding strategy for the XORed result according to yet another embodiment of the present disclosure.

As illustrated in FIG. 10c, the compressor first checks whether $xor_t$ is equal to 0 or not. If $xor_t=0$ (i.e., $v_t'=v_{t-1}'$), the compressor writes two bits of "01". If $xor_t \neq 0$, the compressor further checks whether $C_2$ is satisfied. If $C_2$ is satisfied, the compressor further writes one bit of "0" followed by the actual center bits. If $C_2$ is not satisfied, the compressor further checks if the number of center bits is greater than 16.

If the number of center bits is not greater than 16, the compressor further writes one bit of "0", and stores the leading zeros count and center bits count with 3 bits and 4 bits respectively, followed by the actual center bits. If the number of center bits is greater than 16, the compressor further writes one bit of "1", and stores the leading zeros count and center bits count with 3 bits and 6 bits respectively, followed by the actual center bits. The encoding strategy illustrated in FIG. 10c are just alternative examples, any other encoding strategy which can also arrive the same effect could also be used herein.

Experiments:

TABLE 1

| | | Dataset | #Records | β | Time Span |
|---|---|---|---|---|---|
| Time Series | Small β | City-temp (CT) | 2,905,887 | 3 | 25 years |
| | | IR-bio-temp (IR) | 380,817,839 | 3 | 7 years |
| | | Wind-speed (WS) | 199,570,396 | 2 | 6 years |
| | | PM10-dust (PM10) | 222,911 | 3 | 5 years |
| | Medium β | Stocks-UK (SUK) | 115,146,731 | 5 | 1 year |
| | | Stock-USA (SUSA) | 374,428,996 | 4 | 1 year |
| | | Stocks-DE (SDE) | 45,403,710 | 6 | 1 year |
| | | Dewpoint-temp (DT) | 5,413,914 | 4 | 3 years |
| | | Air-pressure (AP) | 137,721,453 | 7 | 6 years |
| | | Basel-wind (BW) | 124,079 | 8 | 14 years |
| | | Basel-temp (BT) | 124,079 | 9 | 14 years |
| | | Bitcoin-price (BP) | 2,741 | 9 | 1 month |
| | | Bird-migration (BM) | 17,964 | 7 | 1 year |
| | Large β | Air-sensor (AS) | 8,664 | 17 | 1 hour |
| Non Time Series | Small β | Food-price (FP) | 2,050,638 | 3 | — |
| | | Vehicle-charge (VC) | 3,395 | 3 | — |
| | Medium β | Blockchain-tr (BTR) | 231,031 | 5 | — |
| | | SD-bench (SB) | 8,927 | 4 | — |
| | | City-lat (CLat) | 41,001 | 6 | — |
| | | City-lon (CLon) | 41,001 | 7 | — |
| | Large β | POI-lat (PLat) | 424,205 | 16 | — |
| | | POI-lon (PLon) | 424,205 | 16 | — |

Experiments are performed to verify the performance of the above described erasing-based lossless compression method for floating-point values and the erasing-based lossless decompression method for floating-point values.

1. Datasets: 22 datasets including 14 time series and 8 non time series, which are further divided into three categories respectively according to their average decimal significand counts as described in the above Table 1.

Baselines: we compare Elf compression method algorithm with 9 existing compression methods. The erasing based lossless compression method for floating-point values as described in the embodiments above is denoted as Elf, and the one that further adopts the significand count optimization and start position optimization is denoted as Elf+.

Metrics: We verify the performance of various methods in terms of three metrics: compression ratio, compression time and decompression time. Note that the compression ratio is defined as the ratio of the compressed data size to the original one.

2. Settings: As Chimp did, we regard 1,000 records of each dataset as a block. Each compression method is executed on up to 100 blocks per dataset, and the average metrics of one block are finally reported. By default, we regard each value as a double value. All experiments are conducted on a personal computer equipped with Windows 11, 11th Gen Intel® Core(TM) i5-11400 @ 2.60 GHz CPU and 16 GB memory. The JDK (Java Development Kit) version is 1.8.

Performance: the performance of Elf and Elf+ are listed in the table 2 below.

Compression ratio: as illustrated in Table 2 below, among all the floating-point compression methods, the erasing based lossless compression method (i.e., Elf) described in embodiments of the present disclosure has the best compression ratio on almost all datasets. In particular, for the time series datasets, compared with Gorilla and EPC, the Elf has an average relative improvement of (0.76-0.37)/0.76≈51%. Thanks to the erasing technique and elaborate XORcmp, Elf can still achieve relative improvement of 47% and 12% over Chimp and Chimp128 respectively on the time series datasets. For the non-time series datasets, Elf is also relatively (0.63-0.55)/0.63≈12.7% better than the best competitor Chimp128. We notice that there are few datasets that Chimp128 is slightly better than Elf in terms of compression ratio. For the datasets of WS, SUSA and BT, we find that there are many duplicate values within 128 consecutive records. In this case, Chimp128 can use only 9 bits to represent the same value. For the datasets of AS, PLat and PLon, since they have large decimal significand counts, Elf does not perform erasing but still consumes some flag bits. As pointed out by Gorilla, real-world floating point measurements often have a decimal place count of one or two, which usually results in small or medium $\beta$. To this end, Elf can achieve good performance in most real-world scenarios.

As illustrated in Table 2 below, for both time series and non-time series with small and medium $\beta$, Elf+ even outperforms the best competitor Chimp128 for datasets WS and SUSA, in which Chimp128 has a slightly better compression ration than Elf. This is because Elf+ takes full advantage of the fact that most values in a time series have the

TABLE 2

| | | | Times Series | | | | | | | |
|---|---|---|---|---|---|---|---|---|---|---|
| | | | Small $\beta$ | | | | Medium $\beta$ | | | |
| | | Dataset | CT | IR | WS | PM10 | SUK | SUSA | SDE | DT |
| Compression Ratio | Floating | Gorilla | 0.85 | 0.64 | 0.83 | 0.48 | 0.58 | 0.68 | 0.72 | 0.83 |
| | | Chimp | 0.64 | 0.59 | 0.81 | 0.46 | 0.52 | 0.64 | 0.67 | 0.77 |
| | | Chimp$_{128}$ | 0.32 | 0.24 | 0.23 | 0.21 | 0.29 | 0.23 | 0.27 | 0.35 |
| | | FPC | 0.75 | 0.61 | 0.85 | 0.50 | 0.74 | 0.70 | 0.73 | 0.82 |
| | | Elf | 0.25 | 0.21 | 0.25 | 0.16 | 0.22 | 0.24 | 0.26 | 0.31 |
| | | Elf+ | 0.22 | 0.15 | 0.20 | 0.11 | 0.19 | 0.18 | 0.23 | 0.26 |
| | General | Xz | 0.18 | 0.16 | 0.15 | 0.11 | 0.16 | 0.17 | 0.19 | 0.27 |
| | | Brotli | 0.20 | 0.18 | 0.17 | 0.12 | 0.19 | 0.20 | 0.22 | 0.32 |
| | | LZ4 | 0.36 | 0.36 | 0.37 | 0.27 | 0.39 | 0.39 | 0.41 | 0.52 |
| | | Zstd | 0.22 | 0.24 | 0.19 | 0.14 | 0.22 | 0.24 | 0.26 | 0.38 |
| | | Snappy | 0.29 | 0.30 | 0.27 | 0.21 | 0.32 | 0.32 | 0.35 | 0.51 |
| Compression Time ($\mu$s) | Floating | Gorilla | 18 | 21 | 17 | 15 | 17 | 17 | 17 | 18 |
| | | Chimp | 23 | 21 | 22 | 18 | 23 | 22 | 23 | 24 |
| | | Chimp$_{128}$ | 23 | 23 | 22 | 20 | 24 | 22 | 25 | 26 |
| | | FPC | 34 | 40 | 40 | 40 | 28 | 28 | 28 | 31 |
| | | Elf | 51 | 53 | 59 | 50 | 54 | 56 | 58 | 57 |
| | | Elf+ | 34 | 35 | 53 | 30 | 40 | 39 | 43 | 39 |
| | General | Xz | 948 | 1106 | 810 | 1056 | 877 | 836 | 900 | 1045 |
| | | Brotli | 1039 | 1655 | 1557 | 1449 | 1584 | 1611 | 1693 | 1702 |
| | | LZ4 | 1082 | 1106 | 963 | 984 | 966 | 976 | 952 | 1091 |
| | | Zstd | 209 | 212 | 112 | 208 | 177 | 112 | 117 | 218 |
| | | Snappy | 195 | 236 | 52 | 214 | 169 | 56 | 172 | 195 |
| Decompression Time ($\mu$s) | Floating | Gorilla | 16 | 18 | 17 | 21 | 16 | 17 | 17 | 17 |
| | | Chimp | 24 | 22 | 24 | 19 | 22 | 24 | 24 | 54 |
| | | Chimp$_{128}$ | 17 | 16 | 16 | 15 | 18 | 16 | 18 | 18 |
| | | FPC | 28 | 28 | 26 | 29 | 25 | 24 | 25 | 25 |
| | | Elf | 38 | 44 | 46 | 43 | 37 | 45 | 44 | 45 |
| | | Elf+ | 27 | 25 | 33 | 27 | 28 | 29 | 31 | 30 |
| | General | Xz | 161 | 147 | 114 | 125 | 156 | 133 | 148 | 226 |
| | | Brotli | 61 | 58 | 36 | 53 | 41 | 43 | 69 | 70 |
| | | LZ4 | 40 | 35 | 18 | 37 | 19 | 19 | 18 | 42 |
| | | Zstd | 46 | 48 | 30 | 42 | 31 | 31 | 50 | 45 |
| | | Snappy | 38 | 54 | 20 | 38 | 19 | 21 | 20 | 39 |

| | | | Times Series | | | | | | Non Time Series | |
|---|---|---|---|---|---|---|---|---|---|---|
| | | | Medium $\beta$ | | | Large $\beta$ | | | Small $\beta$ | |
| | | Dataset | AP | BW | BT | BP | BM | AS | Avg. | FP | VC |
| Compression Ratio | Floating | Gorilla | 0.73 | 0.99 | 0.94 | 0.84 | 0.79 | 0.82 | 0.76 | 0.58 | 1.00 |
| | | Chimp | 0.65 | 0.88 | 0.85 | 0.77 | 0.72 | 0.77 | 0.70 | 0.47 | 0.86 |
| | | Chimp$_{128}$ | 0.54 | 0.71 | 0.47 | 0.72 | 0.50 | 0.77 | 0.42 | 0.34 | 0.36 |
| | | FPC | 0.67 | 0.92 | 0.90 | 0.81 | 0.75 | 0.82 | 0.75 | 0.62 | 0.91 |
| | | Elf | 0.31 | 0.59 | 0.58 | 0.56 | 0.42 | 0.85 | 0.37 | 0.23 | 0.34 |
| | | Elf+ | 0.25 | 0.56 | 0.52 | 0.50 | 0.38 | 0.86 | 0.33 | 0.22 | 0.29 |
| | General | Xz | 0.47 | 0.57 | 0.35 | 0.63 | 0.43 | 0.79 | 0.33 | 0.23 | 0.23 |
| | | Brotli | 0.51 | 0.61 | 0.39 | 0.71 | 0.47 | 0.85 | 0.37 | 0.26 | 0.28 |
| | | LZ4 | 0.69 | 0.69 | 0.54 | 0.87 | 0.61 | 1.01 | 0.53 | 0.41 | 0.47 |
| | | Zstd | 0.58 | 0.61 | 0.41 | 0.75 | 0.51 | 0.91 | 0.40 | 0.30 | 0.34 |
| | | Snappy | 0.73 | 0.75 | 0.54 | 0.99 | 0.61 | 1.00 | 0.51 | 0.39 | 0.42 |

TABLE 2-continued

| | | | | | | | | | | | |
|---|---|---|---|---|---|---|---|---|---|---|---|
| Compression Time (μs) | Floating | Gorilla | 20 | 21 | 20 | 19 | 18 | 20 | 18 | 16 | 19 |
| | | Chimp | 20 | 26 | 25 | 24 | 25 | 27 | 23 | 21 | 24 |
| | | $Chimp_{128}$ | 38 | 47 | 35 | 48 | 38 | 50 | 32 | 27 | 27 |
| | | FPC | 40 | 42 | 47 | 27 | 30 | 38 | 35 | 39 | 43 |
| | | Elf | 51 | 73 | 69 | 63 | 65 | 87 | 60 | 52 | 55 |
| | | Elf+ | 59 | 72 | 54 | 42 | 51 | 82 | 48 | 41 | 42 |
| | General | Xz | 1959 | 1527 | 1100 | 1531 | 1444 | 2146 | 1235 | 898 | 1636 |
| | | Brotli | 2074 | 1792 | 1715 | 1729 | 1827 | 1798 | 1704 | 1741 | 1674 |
| | | LZ4 | 1285 | 1013 | 1010 | 1001 | 1000 | 1026 | 1032 | 985 | 974 |
| | | Zstd | 317 | 259 | 291 | 271 | 256 | 277 | 217 | 211 | 227 |
| | | Snappy | 179 | 189 | 200 | 169 | 261 | 158 | 175 | 188 | 250 |
| Decompression Time (μs) | Floating | Gorilla | 18 | 23 | 18 | 16 | 17 | 20 | 18 | 16 | 18 |
| | | Chimp | 19 | 30 | 26 | 27 | 25 | 25 | 26 | 21 | 26 |
| | | $Chimp_{128}$ | 22 | 28 | 21 | 26 | 22 | 25 | 20 | 18 | 19 |
| | | FPC | 32 | 27 | 31 | 24 | 26 | 34 | 28 | 28 | 29 |
| | | Elf | 41 | 58 | 53 | 48 | 48 | 29 | 44 | 33 | 44 |
| | | Elf+ | 44 | 41 | 45 | 34 | 36 | 35 | 33 | 30 | 33 |
| | General | Xz | 435 | 427 | 284 | 479 | 345 | 629 | 272 | 196 | 194 |
| | | Brotli | 109 | 97 | 79 | 93 | 87 | 100 | 71 | 103 | 70 |
| | | LZ4 | 56 | 42 | 38 | 40 | 38 | 44 | 35 | 36 | 37 |
| | | Zstd | 99 | 66 | 113 | 72 | 62 | 68 | 57 | 45 | 47 |
| | | Snappy | 49 | 40 | 42 | 41 | 46 | 48 | 37 | 40 | 39 |

| | | | Non Time Series | | | | | | |
|---|---|---|---|---|---|---|---|---|---|
| | | | Medium B | | | | Large B | | |
| | | Dataset | BTR | SB | CLat | CLon | PLat | PLon | Avg. |
| Compression Ratio | Floating | Gorilla | 0.74 | 0.63 | 1.03 | 1.03 | 1.03 | 1.03 | 0.88 |
| | | Chimp | 0.67 | 0.55 | 0.92 | 0.98 | 0.90 | 0.99 | 0.79 |
| | | $Chimp_{128}$ | 0.55 | 0.27 | 0.78 | 0.85 | 0.90 | 0.99 | 0.63 |
| | | FPC | 0.69 | 0.59 | 0.96 | 1.00 | 0.95 | 1.00 | 0.84 |
| | | Elf | 0.36 | 0.27 | 0.56 | 0.63 | 0.96 | 1.06 | 0.55 |
| | | Elf+ | 0.30 | 0.23 | 0.51 | 0.60 | 0.98 | 1.07 | 0.52 |
| | General | Xz | 0.40 | 0.13 | 0.60 | 0.63 | 0.93 | 0.96 | 0.51 |
| | | Brotli | 0.43 | 0.14 | 0.65 | 0.68 | 0.94 | 0.96 | 0.54 |
| | | LZ4 | 0.53 | 0.30 | 0.79 | 0.82 | 1.00 | 1.00 | 0.67 |
| | | Zstd | 0.45 | 0.17 | 0.68 | 0.71 | 0.94 | 0.96 | 0.57 |
| | | Snappy | 0.54 | 0.25 | 0.83 | 0.87 | 1.00 | 1.00 | 0.66 |
| Compression Time (μs) | Floating | Gorilla | 18 | 16 | 19 | 19 | 19 | 19 | 18 |
| | | Chimp | 22 | 20 | 26 | 26 | 23 | 26 | 23 |
| | | $Chimp_{128}$ | 39 | 23 | 48 | 48 | 45 | 46 | 38 |
| | | FPC | 43 | 41 | 42 | 48 | 40 | 48 | 43 |
| | | Elf | 62 | 48 | 64 | 70 | 71 | 72 | 62 |
| | | Elf+ | 43 | 35 | 51 | 63 | 48 | 66 | 49 |
| | General | Xz | 1036 | 1040 | 1252 | 1516 | 1476 | 1351 | 1276 |
| | | Brotli | 1755 | 1522 | 1692 | 1712 | 1628 | 1633 | 1669 |
| | | LZ4 | 1060 | 976 | 988 | 986 | 966 | 957 | 987 |
| | | Zstd | 251 | 202 | 236 | 245 | 206 | 113 | 211 |
| | | Snappy | 190 | 200 | 207 | 238 | 178 | 149 | 200 |
| Decompression Time (μs) | Floating | Gorilla | 17 | 16 | 17 | 17 | 17 | 17 | 17 |
| | | Chimp | 24 | 21 | 26 | 26 | 24 | 26 | 24 |
| | | $Chimp_{128}$ | 22 | 17 | 26 | 26 | 23 | 24 | 22 |
| | | FPC | 29 | 29 | 30 | 36 | 28 | 35 | 31 |
| | | Elf | 49 | 39 | 52 | 57 | 31 | 33 | 42 |
| | | Elf+ | 33 | 30 | 41 | 49 | 33 | 36 | 36 |
| | General | Xz | 312 | 126 | 434 | 461 | 664 | 663 | 381 |
| | | Brotli | 86 | 58 | 243 | 85 | 86 | 77 | 101 |
| | | LZ4 | 39 | 37 | 38 | 37 | 35 | 19 | 35 |
| | | Zstd | 60 | 44 | 47 | 48 | 43 | 32 | 46 |
| | | Snappy | 39 | 36 | 42 | 37 | 32 | 43 | 38 |

Compression time and decompression time: Elf takes a little more time than other floating-point compression algorithms during both compression and decompression processes. Compared with other floating-point compression algorithms, Elf adds an erasing step and a restoring step, which inevitably takes more time. However, the difference is not obvious, since they are all on the same order of magnitude. For almost all datasets, Elf+ takes even less time than Elf during both compression and decompression processes.

In summary, Elf can usually achieve remarkable compression ratio improvement for both time series data sets and non-time series datasets, with affordable cost of more time. Elf+ even performs better than Elf in terms both of compression ratio and running time.

Following single floating-point data occupying 32 bits are took as an example to explain the embodiments of the present disclosure in detail.

A single-precision floating-point value (abbr. single value) has a similar underlying storage layout to that of a double value, but it takes up only 32 bits, where 1 bit is for the sign, 8 values, we should make the following modifications.

The Normal Number for Single Value Satisfies:

$$v = (-1)^s \times 2^{e-127} \times \left(1 + \sum_{i=1}^{23} m_i \times 2^{-i}\right)$$

$$e = (e_1 e_2 \ldots e_8)_2 = \sum_{i=1}^{8} e^i \times 2^{8-i}$$

If let $m_0=1$ and $BF(v)=\pm(b_{\bar{n}-1}b_{\bar{n}-2} \ldots b_0 \cdot b_{-1} b_{-2} \ldots b_{\bar{l}})_2$, we have $b_{-i}=m_{i+e-127}$, $i>0$.

In an alternative implementation, for a single floating point value, the reference mantissa bit may be determined by:

$$g(\alpha) = \lceil \alpha \times \log_2 10 \rceil + e - 127$$

$$e = (e_1 e_2 \ldots e_8)_2 = \sum_{i=1}^{8} e^i \times 2^{8-i}$$

where $\alpha$ denotes the decimal place count of the floating-point value, $g(\alpha)$ denotes the place of the reference mantissa bit in the mantissa bits of the floating-point value, and $e_i$ denotes a digit on the $i^{th}$ exponent bit in the exponent bits of the floating-point value.

In an alternative implementation, for a single floating point value, when $\delta=0$, it indicates that v itself has long trailing zeros. Thus, the erasing operation may be performed in response to $\delta\neq0$, i.e., the erasing operation may be performed in response to determining that a digit on a mantissa bit following the reference mantissa bit is not zero.

In an alternative implementation, for a single floating point value, the erasing operation may be performed in response to $\delta\neq0$ and $\beta^*<8$. When the erasing operation is performed in response to $\delta\neq0$ and $\beta^*<8$, a positive gain on compression ratio may be ensured while ensuring the lossless compression on floating-point value.

In an alternative implementation, for a single floating point value, the erasing operation may be performed in response to $\delta\neq0$ and $23-g(\alpha)>3$. When the erasing operation is performed in response to $\delta\neq0$ and $23-g(\alpha)>3$, a positive gain on compression ratio may be ensured while ensuring the lossless compression on floating-point value.

In an alternative implementation, for a single floating point value, the erasing operation is performed in response to $\beta^*<8$ and $\delta\neq0$ and $23-g(\alpha)>3$. The other processing operations such as compression, decompression, encoding strategies for $\beta^*$ and the XORed result are similar to those described for the double value, and would not be repeated herein.

Figure 11:
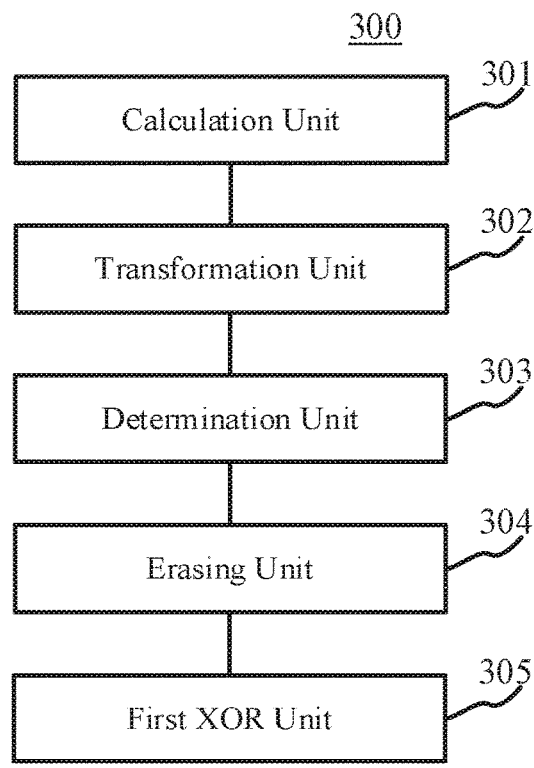
FIG. 11 is a schematic structural diagram of an erasing-based lossless compression apparatus for floating-point values according to an embodiment of the present disclosure.

According to another embodiment of the present disclosure, an erasing-based lossless compression apparatus for floating-point values is provided. FIG. 11 illustrates an erasing-based lossless compression apparatus 300. The apparatus may be provided in a computer.

As illustrated in FIG. 11, the apparatus 300 includes: a calculation unit 301, configured to acquire a floating-point value, and calculate a decimal place count of the floating-point value; a transformation unit 302, configured to transform the floating-point value into a binary format, where the floating-point value in the binary format is composed of a digit on a sign bit, digits on exponent bits, and digits on mantissa bits; a determination unit 303, configured to determine, in the mantissa bits, a reference mantissa bit based on the decimal place count and the digits on the exponent bits; a erasing unit 304, configured to perform erasing operation on bits following the reference mantissa bit by setting corresponding digits on the bits following the reference mantissa bit to be zero, to obtain a value in the binary format, and use the value in the binary format obtained by the erasing operation as a mantissa prefix number of the floating-point value; a first XOR unit 305, configured to input the mantissa prefix number of the floating-point value into an XOR based compressor, to obtain an XORed result; and a storing unit, configured to store the XORed result.

It should be noted that the apparatus shown in FIG. 11 is corresponding to the method illustrated in FIG. 3. The embodiments or implementations of the method illustrated in FIG. 3 are also applicable to the apparatus 300, and will be not repeated herein.

Figure 12:
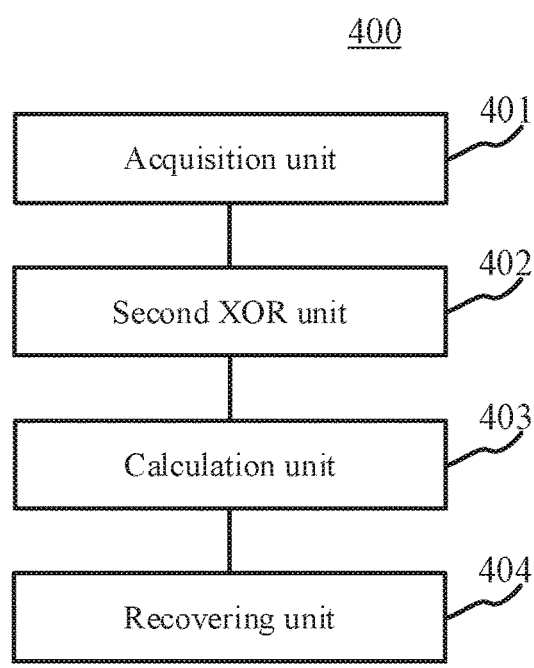
FIG. 12 is a schematic structural diagram of an erasing-based lossless decompression apparatus for floating-point values according to an embodiment of the present disclosure.

According to another embodiment of the present disclose, an erasing-based lossless decompression apparatus for floating-point values is provided. FIG. 12 illustrates an erasing-based lossless decompression apparatus 400. The apparatus may be provided in a computer.

As illustrated in FIG. 12, the apparatus 400 includes:
- an acquisition unit 401, configured to acquire an XORed result and a modified decimal significand count of a floating-point value;
- a second XOR unit 402, configured to perform XOR operation on the XORed result and the mantissa prefix number of the previous floating-point value, to obtain the mantissa prefix number of the floating-point value;
- a calculation unit 403, configured to calculate a decimal place count of the floating-point value based on the modified decimal significand count of a floating-point value; and
- a recovering unit 404, configured to recover the floating-point value based on the mantissa prefix number of the floating-point value and the decimal place count of the floating-point value.

It should be noted that the apparatus shown in FIG. 12 is corresponding to the method illustrated in FIG. 5. The embodiments or implementations of the method illustrated in FIG. 5 are also applicable to the apparatus 400, and will be not repeated herein.

According to yet another embodiment of the present disclosure, a non-transitory computer readable medium is provided. The non-transitory computer readable medium stores a computer program thereon, the program, when executed by a processor, causing the processor to implement any one of the methods described above.

According to yet another embodiment of the present disclosure, an electronic device is provided. The electronic device includes one or more processors; a storage apparatus, storing one or more programs thereon, the one or more programs, when executed by the one or more processors, causing the one or more processors to implement any one of the methods described above.

It should be noted that in one or more of the above embodiments, the functions described in embodiments of the disclosure can be implemented by hardware, software, firmware, or any combination of them. When implemented by software, these functions can be stored in computer readable medium or transmitted as one or more instructions or codes on computer readable medium.

It should be understood that the various forms of processes shown above may be used to reorder, add, or delete steps. For example, the steps described in the present disclosure may be performed in parallel, sequentially, or in different orders. As long as the desired results of the technical solution disclosed in the present disclosure can be achieved, no limitation is made herein.

The above specific embodiments do not constitute limitation on the protection scope of the present disclosure. Those skilled in the art should understand that various modifications, combinations, sub-combinations and substitutions may be made according to design requirements and other factors. Any modification, equivalent replacement and improvement made within the spirit and principle of the present disclosure shall be included in the protection scope of the present disclosure.

What is claimed is:

1. An erasing-based lossless compression method for floating-point values, comprising:
    acquiring a floating-point value, and calculating a decimal place count of the floating-point value;
    transforming the floating-point value into a binary format, wherein the floating-point value in the binary format is composed of a digit on a sign bit, digits on exponent bits, and digits on mantissa bits;
    determining, in the mantissa bits, a reference mantissa bit based on the decimal place count and the digits on the exponent bits;
    performing erasing operation on bits following the reference mantissa bit by setting corresponding digits on the bits following the reference mantissa bit to be zero, to obtain a value in the binary format, and using the value in the binary format obtained by the erasing operation as a mantissa prefix number of the floating-point value; and
    inputting the mantissa prefix number of the floating-point value into an eXclusive OR (XOR) based compressor, to obtain an XORed result, and storing the XORed result.

2. The method according to claim 1, wherein the floating-point value is a double-precision floating-point value.

3. The method according to claim 2, wherein the determining a reference mantissa bit based on the decimal place count and the digits on the exponent bits comprises:
    determining $g_{(\alpha)}$ as a place of the reference mantissa bit in the mantissa bits, wherein $$g(\alpha) = \lceil \alpha \times \log_2 10 \rceil + e - 1023;$$

and $$e = (e_1 e_2 \ldots e_{11})_2 = \sum_{i=1}^{11} e^i \times 2^{11-i},$$

wherein $\alpha$ denotes the decimal place count of the floating-point value, $g(\alpha)$ denotes the place of the reference mantissa bit in the mantissa bits of the floating-point value, and $e_i$ denotes a digit on the $i^{th}$ exponent bit in the exponent bits of the floating-point value.

4. The method according to claim 3, wherein the performing the erasing operation comprises:
    performing the erasing operation in response to determining that a digit on a mantissa bit following the reference mantissa bit is not zero.

5. The method according to claim 1, wherein the method further comprises:
    storing the decimal place count of the floating-point value, so that the XORed result and the decimal place count of the floating-point value form the lossless compressed data for recovering the floating-point value.

6. The method according to claim 2, wherein the method further comprises:
    calculating a modified decimal significand count of the floating-point value by $$\beta^* = DS^*(v) = \begin{cases} 0 & v = 10^{-i}, i > 0 \\ \beta & \text{others} \end{cases},$$

and storing the modified decimal significand count of the floating-point value, so that the XORed result and the modified decimal significand count of the floating-point value form the lossless compressed data for recovering the floating-point value,
where v denotes the floating-point value, $\beta^*$ denotes the modified decimal significand count of the floating-point value, and $\beta$ denotes a decimal significand count of the floating-point value.

7. The method according to claim 6, wherein the performing the erasing operation comprises:
    performing the erasing operation in response to determining that a digit on a mantissa bit following the reference mantissa bit is not zero, and $\beta^* < 16$ and $52 - g_{(\alpha)} > 4$.

8. The method according to claim 6, wherein the storing the modified decimal significand count of the floating-point value comprises:
    in response to determining that a digit on a mantissa bit following the reference mantissa bit is not zero, and $\beta^* < 16$ and $52 - g_{(\alpha)} > 4$, writing a first flag code to indicate performing the erasing operation, and writing 4 bits of $\beta^*$ following the first flag code; and
    in response to determining that digits on mantissa bits following the reference mantissa bit are zero, or $\beta^* \geq 16$ or $52 - g_{(\alpha)} \leq 4$, writing a second flag code to indicate not performing the erasing operation.

9. The method according to claim 6, wherein the storing the modified decimal significand count of the floating-point value comprises:
    in response to determining that a digit on a mantissa bit following the reference mantissa bit is not zero, and $\beta^* < 16$ and $52 - g_{(\alpha)} > 4$ and $\beta^* = \beta^*_{pre}$, writing a third flag code to indicate performing the erasing operation and that $\beta^*$ is identical to $\beta^*_{pre}$;
    in response to determining that a digit on a mantissa bit following the reference mantissa bit is not zero, and $\beta^* < 16$ and $52 - g_{(\alpha)} > 4$ and $\beta^* \neq \beta^*_{pre}$, writing a fourth flag code to indicate performing the erasing operation and that $\beta^*$ is not identical to $\beta^*_{pre}$, and writing 4 bits of $\beta^*$ following the flag code; and
    in response to determining that digits on mantissa bits following the reference mantissa bit are zero, or $\beta^* \geq 16$ or $52 - g_{(a)} \leq 4$, writing a second flag code to indicate not performing the erasing operation, and
    wherein each of the second, third, and fourth flag codes occupies one or two bits.

10. The method according to claim 6, wherein the storing the modified decimal significand count of the floating-point value comprises:
    in response to determining that a digit on a mantissa bit following the reference mantissa bit is not zero, and $\beta^* < 16$ and $52 - g_{(a)} > 4$ and $\beta^* = \beta^*$, writing a flag code of one bit to indicate performing the erasing operation and that $\beta^*$ is identical to $\beta^*$ pre;
    in response to determining that a digit on a mantissa bit following the reference mantissa bit is not zero, and $\beta^* < 16$ and $52 - g_{(\alpha)} > 4$ and $\beta^* * \beta^*_{pre}$, writing a flag code of two bits to indicate performing the erasing operation and that β* is not identical to β*$_{pre}$, and writing 4 bits of β* following the flag code; and in response to determining that digits on mantissa bits following the reference mantissa bit are zero, or β* >16 or 52−g$_{(α)}$≤4, writing another flag code of two bits to indicate not performing the erasing operation.

11. The method according to claim 1, wherein for each XORed result xor$_t$, t>1, the method further comprises:

assigning leading zeros count lead$_t$ thereof to be zero, in response to determining that actual leading zeros count thereof is located within a range of zero to seven;

assigning the leading zeros count lead$_t$ thereof to be eight, in response to determining that actual leading zeros count thereof is located within a range of eight to eleven;

assigning the leading zeros count lead$_t$ thereof to be twelve, in response to determining that actual leading zeros count thereof is located within a range of twelve to fifteen;

assigning the leading zeros countlead$_t$ thereof to be sixteen, in response to determining that actual leading zeros count thereof is located within a range of sixteen to seventeen;

assigning the leading zeros count lead$_t$ thereof to be eighteen, in response to determining that actual leading zeros count thereof is located within a range of eighteen to nineteen;

assigning the leading zeros count lead thereof to be twenty, in response to determining that actual leading zeros count thereof is located within a range of twenty to twenty-one;

assigning the leading zeros count lead$_t$ thereof to be twenty-two, in response to determining that actual leading zeros count thereof is located within a range of twenty-two to twenty-three; and assigning the leading zeros count lead$_t$ thereof to be twenty-four, in response to determining that actual leading zeros count thereof is twenty-four.

12. The method according to claim 11, wherein the storing the XORed result comprises:

checking whether the XORed result is zero;

in response to determining that the XORed result is zero, writing a flag code of one bit;

in response to determining that the XORed result is not zero, and lead$_t$=lead$_{t-1}$ and trail, > trail$_{t-1}$ are satisfied, writing a flag code of two bits followed by digits on center bits; and in response to determining that the XORed result is not zero, and lead$_t$=lead$_{t-1}$ and trail$_t$≥ trail$_{t-1}$ are not satisfied, writing a different flag code of two bits followed by lead$_t$, center bits count and digits on center bits, and wherein lead$_t$ denotes leading zeros count of the XORed result, and lead$_{t-1}$ denotes leading zeros count of a previous XORed result, trail$_t$ denotes trailing zeros count of the XORed result, and lead$_{t-1}$ denotes trailing zeros count of the previous XORed result.

13. The method according to claim 11, wherein the storing the XORed result comprises:

checking whether the XORed result is zero;

in response to determining that the XORed result is zero, writing a flag code of two bits;

in response to determining that the XORed result is not zero, and lead$_t$=lead$_{t-1}$ and trail$_t$≥ trail$_{t-1}$ are satisfied, writing a flag code of one bit followed by another flag code of one bit and digits on center bits; and in response to determining that the XORed result is not zero, and lead$_t$=lead$_{t-1}$ and trail$_t$≥ trail$_{t-1}$ are not satisfied, further checking whether center bits count is less than or equal to 16: in response to determining that the center bits count is less than or equal to 16, writing an additional flag code of one bit, followed by leading zeros count, center bits count and digits on center bits;

in response to determining that center bits count is greater than 16, writing a different additional flag code of one bit, followed by leading zeros count, center bits count and digits on center bits, and wherein lead$_t$ denotes leading zeros count of the XORed result, and lead$_{t-1}$ denotes leading zeros count of a previous XORed result, trail$_t$ denotes trailing zeros count of the XORed result, and lead$_{t-1}$ denotes trailing zeros count of the previous XORed result.

14. The method according to claim 1, wherein the floating-point value is a single-precision floating-point value, wherein the determining a reference mantissa bit based on the decimal place count and the digits on the exponent bits comprises determining g$_{(a)}$ as a place of the reference mantissa bit in the mantissa bits, wherein $$g(\alpha) = \lceil \alpha \times \log_2 10 \rceil + e - 127, \text{ and}$$

$$e = (e_1 e_2 \ldots e_8)_2 = \sum_{i=1}^{8} e^i \times 2^{8-i},$$

and wherein α denotes the decimal place count of the floating-point value, g(α) denotes the place of the reference mantissa bit in the mantissa bits of the floating-point value, and e$_i$ denotes a digit on the i$^{th}$ exponent bit in the exponent bits of the floating-point value.

15. The method according to claim 1, wherein the calculating a decimal place count of the floating-point value includes:

iteratively checking if v×10$^i$=[v×10$^i$] holds, where i is sequentially from sp* to at most sp* +17, and sp* is calculated by $$sp^* = \begin{cases} 1 & SP(v) \geq 0 \\ -SP(v) & SP(v) < 0 \end{cases},$$

where SP(v) denotes start decimal significand position of floating-point value v; and determining a value i that first makes the equation v×10$^i$= [v×10$^i$] holds as the decimal place count.

16. The method according to claim 15, wherein the start position SP(v) is calculated by:

levering two sorted exponential arrays Log Arr1={10$^0$, 10$^1$, . . . , 10$^i$, . . . } and Log Arr2= {10$^0$, 10$^{-1}$, . . . , 10$^{-j}$, . . . }, where i<10, and j<10;

sequentially scanning the two arrays;

in response to determining that v≥1 and 10$^i$≤v≤10$^{i+1}$, determining SP(v)=i;

in response to determining that v<1 and 10$^{-j}$≤v10$^{-10}$, determining SP(v)=−j; and in response to determining that v ≥10$^{10}$ or v≤10$^{-10}$, determining SP(v)=⌊log$_{10}$|v|⌋.

17. An erasing-based lossless decompression method for floating-point values, comprising:

acquiring an XORed result and a modified decimal significand count of a floating-point value, wherein the XORed result is obtained during compression of the floating-point value by performing XOR operation on a mantissa prefix number of the floating-point value and a mantissa prefix number of a previous floating-point value;

performing XOR operation on the XORed result and the mantissa prefix number of the previous floating-point value, to obtain a mantissa prefix number of the floating-point value;

calculating a decimal place count of the floating-point value based on the modified decimal significand count of a floating-point value; and recovering the floating-point value based on the mantissa prefix number of the floating-point value and the decimal place count of the floating-point value.

18. The method according to claim 17, wherein the calculating the decimal place count of the floating-point value comprises:

calculating the decimal place count of the floating-point value based on the modified decimal significand count of the floating-point value, comprising:

in response to determining that $\beta^*$ equals to zero, determining that $v=10^{-i}$, $i=SP(v')+1$; and in response to determining that $\beta^*$ does not equal to zero, assigning $\beta=\beta^*$, recovering the decimal place count of the floating-point value by $$\alpha = \begin{cases} \beta - (SP(v') + 1) & v \neq 10^{-i}, i > 0 \\ \beta - (SP(v') + 2) & v = 10^{-i}, i > 0 \end{cases},$$

where $\alpha$ denotes the decimal place count of the floating-point value, v denotes the floating-point value, v' denotes the mantissa prefix number of the floating-point value, $\beta^*$ denotes the modified decimal significand count of the floating-point value, and $\beta$ denotes a decimal significand count of the floating-point value, and SP(v') is start decimal significant position of the mantissa prefix number.

19. The method according to claim 17, wherein the recovering the floating-point value based on the mantissa prefix number of the floating-point value and the decimal place count of the floating-point value, comprises:

transforming the mantissa prefix number of the floating-point value into decimal format;

recovering the floating-point value by $$v = Leaveout(v', \alpha) + 10^{-\alpha},$$

where $Leaveout(v',\alpha)=(d_{h'-1}d_{h'-2} \ldots d_0 d_{-1} d_{-2} \ldots d_{-\alpha})_{10}$ is the operation that leaves out the digits after $d_{-\alpha}$ in $DF(v')= (d_{h'-1}d_{h'-2} \ldots d_0 d_{-1} d_{-2} \ldots d_{-\alpha} d_{-(\alpha+1)} \ldots d_{l'})_{10}$, and where v denotes the floating-point value, v' denotes the mantissa prefix number of the floating-point value, DF(v') is the mantissa prefix number in the decimal format, $d_i$ denotes a digit on the $i^{th}$ place in the mantissa prefix number in the decimal format.

20. An electronic device, comprising:

at least one processor; and a memory communicatively connected to the at least one processor; wherein, the memory stores instructions executable by the at least one processor, and the instructions, when executed by the at least one processor, cause the at least one processor to perform the method according to claim 1.

* * * * *